(12) United States Patent
Choi et al.

(10) Patent No.: US 7,894,062 B2
(45) Date of Patent: Feb. 22, 2011

(54) OVERLAY MEASURING METHOD AND OVERLAY MEASURING APPARATUS USING THE SAME

(75) Inventors: Gyo-Hyung Choi, Hwaseong-si (KR); Jin-Jun Park, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 987 days.

(21) Appl. No.: 11/783,507

(22) Filed: Apr. 10, 2007

(65) Prior Publication Data
US 2007/0280557 A1    Dec. 6, 2007

(30) Foreign Application Priority Data
Apr. 27, 2006    (KR)    ....................... 10-2006-0038074

(51) Int. Cl.
*G01B 11/00*    (2006.01)
(52) U.S. Cl. .................. 356/401; 356/620; 356/625
(58) Field of Classification Search ................ 356/400, 356/401, 620–622, 625, 416; 430/30
See application file for complete search history.

(56) References Cited

U.S. PATENT DOCUMENTS

| | | | |
|---|---|---|---|
| 5,861,320 A | * | 1/1999 | Shiraishi ...................... 438/16 |
| 6,582,978 B2 | * | 6/2003 | Shiraishi ...................... 438/16 |
| 6,937,344 B2 | | 8/2005 | Monshouwer et al. |
| 6,985,618 B2 | | 1/2006 | Adel et al. |
| 7,700,247 B2 | * | 4/2010 | Ausschnitt ................... 430/30 |

* cited by examiner

*Primary Examiner*—L. G Lauchman
(74) *Attorney, Agent, or Firm*—Volentine & Whitt, PLLC

(57) ABSTRACT

An overlay measuring apparatus includes a light source which generates visible light with a plurality of wavelengths, an optical module which selects visible light with a single wavelength from the visible light generated by the light source, makes the visible light with a single wavelength incident on a plurality of overlay patterns, and uses visible light reflected from the plurality of overlay patterns to project the overlay patterns with a predetermined color, an imaging unit which acquires images of the plurality of overlay patterns according to individual wavelengths of the visible light and acquires corresponding image signals, and a control unit which outputs a control signal to the optical module so that the optical module can project the overlay pattern with a specific color using information associated with the individual wavelengths of the visible light that is used to project the overlay pattern image selected by a selection unit.

30 Claims, 9 Drawing Sheets

OVERLAY MEASURING METHOD AND OVERLAY MEASURING APPARATUS USING THE SAME

BACKGROUND OF THE INVENTION

1. Field of the Invention

The present disclosure relates generally to a semiconductor manufacturing method and a semiconductor manufacturing apparatus using the same and, more particularly, to an overlay measuring method and an overlay measuring apparatus using the same.

A claim of priority is made to Korean Patent Application No. 10-2006-0038074, filed Apr. 27, 2006, the disclosure of which is hereby incorporated herein by reference in its entirety.

2. Description of the Related Art

In recent years, there has been a rapid increase in the demand for high-performance electronic devices such as computers and mobile phones. Specifically, there is a demand for smaller size electronic devices that operate at high speeds. Because most electronic devices include semiconductor chips that perform at least a portion of the processing within the device, there is a corresponding increase in demand to develop new semiconductor chips which have high operation speed and high storage capacity, but are yet small in size. Accordingly, there is a movement towards developing semiconductor chips with a high degree of integration, high reliability, and high response speed.

Generally, a semiconductor chip manufacturing process includes a combination of individual unit processes. That is, the chip is subject to a number of discrete processes. Furthermore, the individual unit processes are developed to ensure a high yield rate and throughput. Yet, some errors will inevitably occur during one or more individual unit processes. To this end, efforts are being directed towards researching methods and apparatuses for measuring process errors in individual unit processes. A portion of these efforts is specifically directed to the photolithography process. This is because photolithography, which is an important semiconductor fabrication process, involves frequent variations in processing conditions and processing equipment.

The photolithography process generally involves transferring geometric shapes on a mask to the surface of a silicon wafer. The steps involved in the photolithographic process include wafer cleaning, barrier layer formation, photoresist application, soft baking, mask alignment, exposure and development, and hard-baking. In particular, in the photolithographic process, a photoresist pattern is used as an etching mask to perform patterning of the wafer disposed under the photoresist pattern or of a thin film formed on the wafer.

A reticle is typically used to form an accurate semiconductor pattern on the underlying wafer or thin film formed on the wafer. Specifically, a reticle is used as a pattern mask that allows the photoresist to be selectively exposed and is disposed at a predetermined position. Then, the wafer is aligned to correspond to the position of the reticle. However, under some conditions, the reticle and the wafer may be misaligned. For example, when there is defect in an optical system transmitting light that is incident on the reticle, the reticle and the wafer may be misaligned with respect to each other. Under such conditions, the pattern formed on the wafer may be imprecise. Furthermore, any further patterns formed on the wafer (i.e., patterns formed by following individual processes) will necessarily be imprecise as all additional patterns are aligned with respect to the earlier-formed pattern which was formed imprecisely to being with.

In order to overcome such a problem, reticles used in an exposure process have alignment patterns and overlay patterns formed thereon. Specifically, an alignment pattern is used to align the wafer such that there accurate exposure during the photolithography. Furthermore, the overlay pattern is used to measure whether or not photolithography conditions match each other in the preceding and subsequent processes. In addition, when the reticle is changed, overlay patterns that are formed in the preceding and subsequent processes are overlapped with each other or arranged at predetermined spaces so that they can be compared with each other.

Accordingly, an overlay measuring apparatus measures and compares a difference between the overlay patterns formed in the preceding and subsequent processes and provides a comparison result to an operator or controller of semiconductor fabrication equipment. This comparison result is used by the operator/controller to adjust the semiconductor fabrication equipment so as to form photoresist patterns at accurate positions on the wafer (i.e., precise patterns).

Generally, in a photolithography process, the plurality of overlay patterns are not formed on the same plane. Specifically, each pattern is formed one at a time on a wafer or on a thin film of the wafer. Furthermore, each subsequent pattern is formed on top of a pattern formed during a preceding process. That is, the overlay patterns are stacked on each other such that each overlay pattern is formed on a different plane.

A conventional overlay measuring apparatus includes an optical module which magnifies and projects a plurality of overlay patterns, an imaging unit which acquires image signals corresponding to the projected overlay patterns, and a reading unit. The reading unit performs a number of functions. For example, the reading unit forms images from the image signals acquired by the imaging unit, reads differences in position between overlay pattern images corresponding to the overlay patterns, calculates overlay compensation values, and provides feedback that includes the overlay compensation values, to an exposure unit.

In particular, the optical module irradiates incident light composed of white visible light onto a surface of the wafer and magnifies and projects its reflected light such that the imaging unit can acquire images corresponding to the overlay patterns. Typically, the overlay patterns are formed in trench shape or in protruded block shape with a step of a thin film or photosensitive film formed on the surface of the wafer.

However, the visible light (which has a predetermined wavelength) irradiated from the optical module may be refracted or scattered on an overlay pattern whose line width is close to the wavelength of the visible light. This similarity between the wavelength of the irradiated light and the line width of the overlay pattern may lead to an overlay measurement error. For example, when the incident light composed of white visible light is incident onto the overlay patterns and is refracted or scattered, the reflected light includes at least one of red, blue and green color components. However, the reflected light is processed in black and white. In this process, the imaging unit may distort the entire or at least a portion of the overlay pattern image while processing the reflected light. Accordingly, the reading unit may calculate an incorrect overlay compensation value on the basis of the overlay pattern images that are partially or entirely distorted by the imaging unit. This error in the overlay compensation process may result in a decrease in the yield rate of the photolithography process.

There is therefore a need for systems and methods to provide an accurate overlay compensation value during a semiconductor chip fabrication process. The present disclosure is directed towards overcoming one or more shortcomings associated with the conventional overlay measuring systems and methods.

SUMMARY OF THE INVENTION

One aspect of the present disclosure includes an overlay measuring apparatus. The apparatus includes a light source which generates visible light with a plurality of wavelengths, an optical module which selects visible light with a single wavelength from the visible light generated by the light source, makes the visible light with a single wavelength incident on a plurality of overlay patterns, and uses visible light reflected from the plurality of overlay patterns to project the overlay patterns with a predetermined color, an imaging unit which acquires images of the plurality of overlay patterns according to individual wavelengths of the visible light and acquires image signals corresponding to the images, a database which sequentially stores the image signals acquired by the imaging unit, a selection unit which selects a clear image from the overlay pattern images using the image signals stored in the database, and a control unit which outputs a control signal to the optical module so that the optical module can project the overlay pattern with a specific color using information associated with the individual wavelengths of the visible light that is used to project the overlay pattern image selected by the selection unit.

Another aspect of the present disclosure includes an overlay measuring apparatus. The apparatus includes a light source which generates visible light with a plurality of wavelengths, an optical module which makes the visible light incident on an overlay pattern, and selects visible light with a single wavelength that is reflected from the overlay pattern so that the overlay pattern is projected with a predetermined color, an imaging unit which acquires images of the plurality of overlay patterns according to individual wavelengths of the visible light and acquires image signals corresponding to the images, a database which sequentially stores the image signals acquired by the imaging unit, a selection unit which selects a clear image from the overlay pattern images using the image signals stored in the database, and a control unit which outputs a control signal to the optical module so that the optical module can project the overlay pattern with a specific color using information associated with the single wavelength of the visible light that is used to project the overlay pattern image selected by the selection unit.

Yet another aspect of the present disclosure includes an overlay measuring method. The method includes acquiring a plurality of overlay pattern images according to individual wavelengths of visible light that is used to project a plurality of overlay patterns, storing, in a database, signals corresponding to the plurality of overlay pattern images that are acquired according to individual wavelengths of the visible light, displaying the plurality of overlay pattern images using the image signals stored in the database, comparing clearness of the plurality of overlay patterns appearing on the plurality of overlay pattern images, and selecting, by a selection unit, a clear image from the overlay pattern images on which the plurality of overlay patterns appear, and magnifying and projecting the plurality of overlay patterns using the visible light with a corresponding wavelength that is used to acquire the overlay pattern image selected by the selection unit.

BRIEF DESCRIPTION OF THE DRAWINGS

The above and other features of the present invention will become more apparent to those of ordinary skill in the art by describing in detail exemplary embodiments thereof with reference to the attached drawings in which.

DETAILED DESCRIPTION OF EMBODIMENTS

Figure 1:
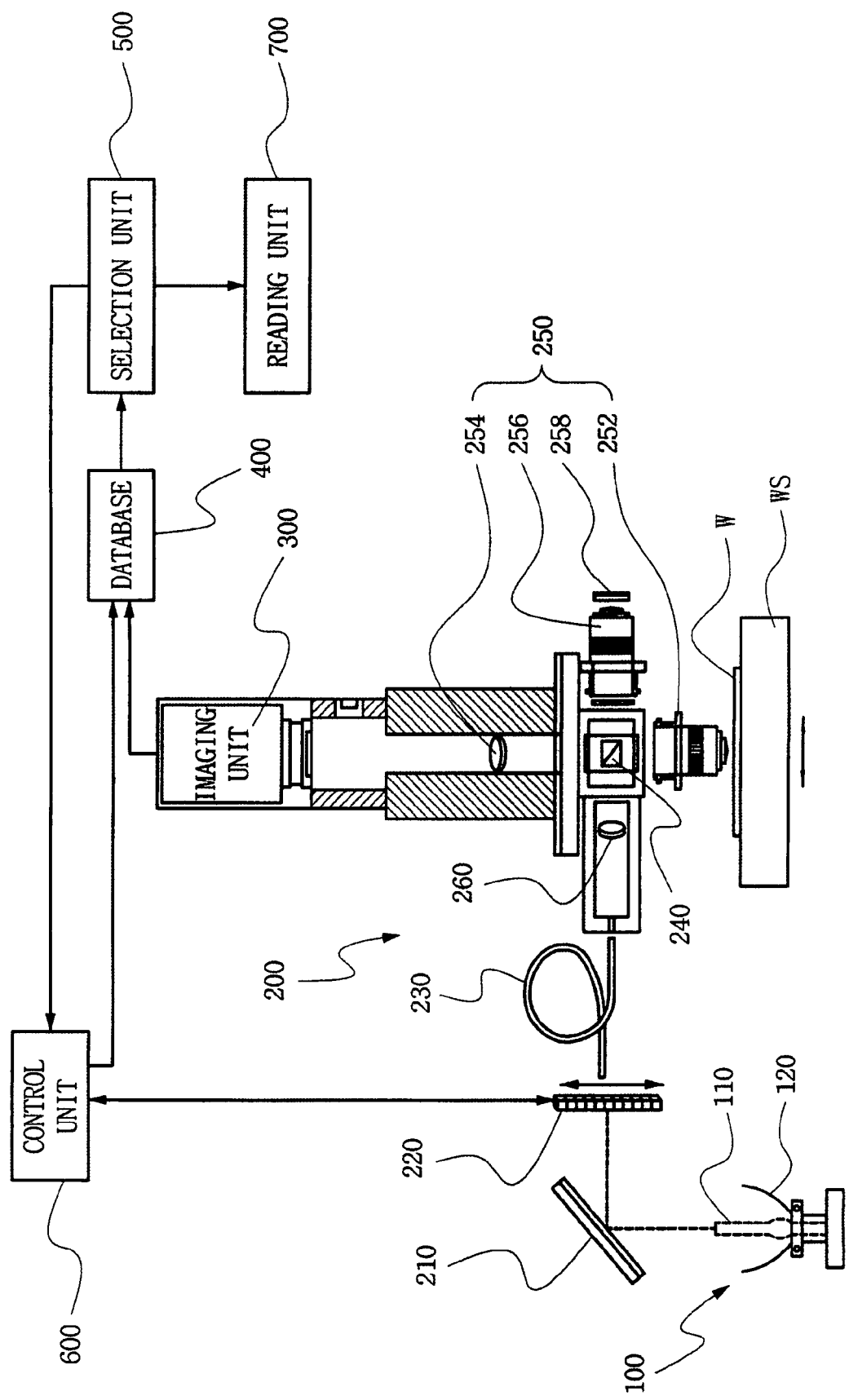
FIG. 1 illustrates a diagram of an overlay measuring apparatus according to an exemplary disclosed embodiment.

Hereinafter, an overlay measuring method and an overlay measuring apparatus using the same according to exemplary embodiments of the present invention will now be described in detail with reference to the accompanying drawings. The present invention may be embodied in various forms and should not be construed as limited to the embodiments as will be described in detail below. The embodiments are provided in order to more fully explain the invention to those having ordinary knowledge in the art. Accordingly, shapes of elements in the drawings are exaggerated in order to emphasize more clear description.

Hereinafter, exemplary embodiments of the invention will be described in more detail with reference to the accompanying drawings.

Figure 2:
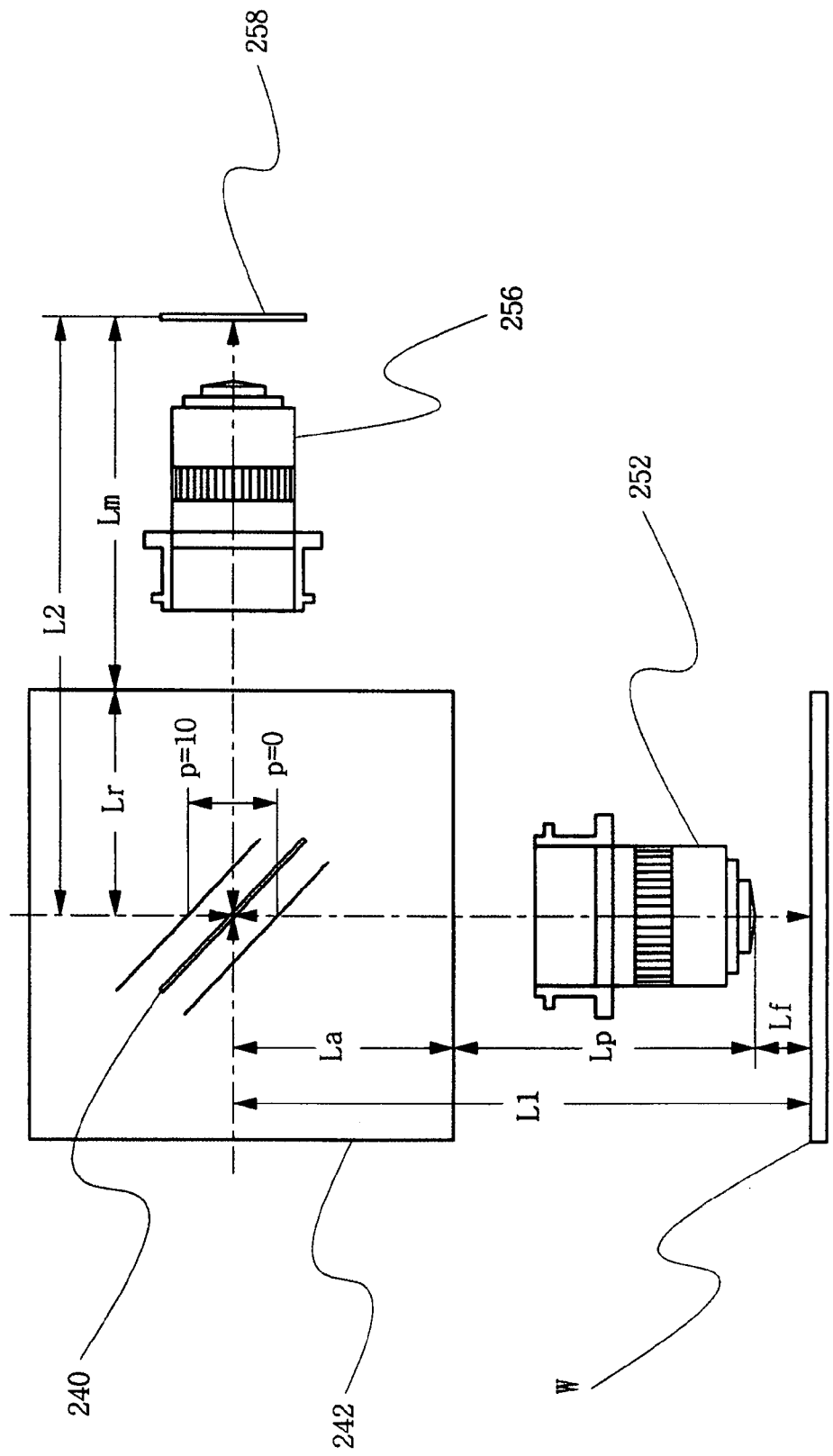
FIG. 2 illustrates an optical module of FIG. 1.
Figure 3:
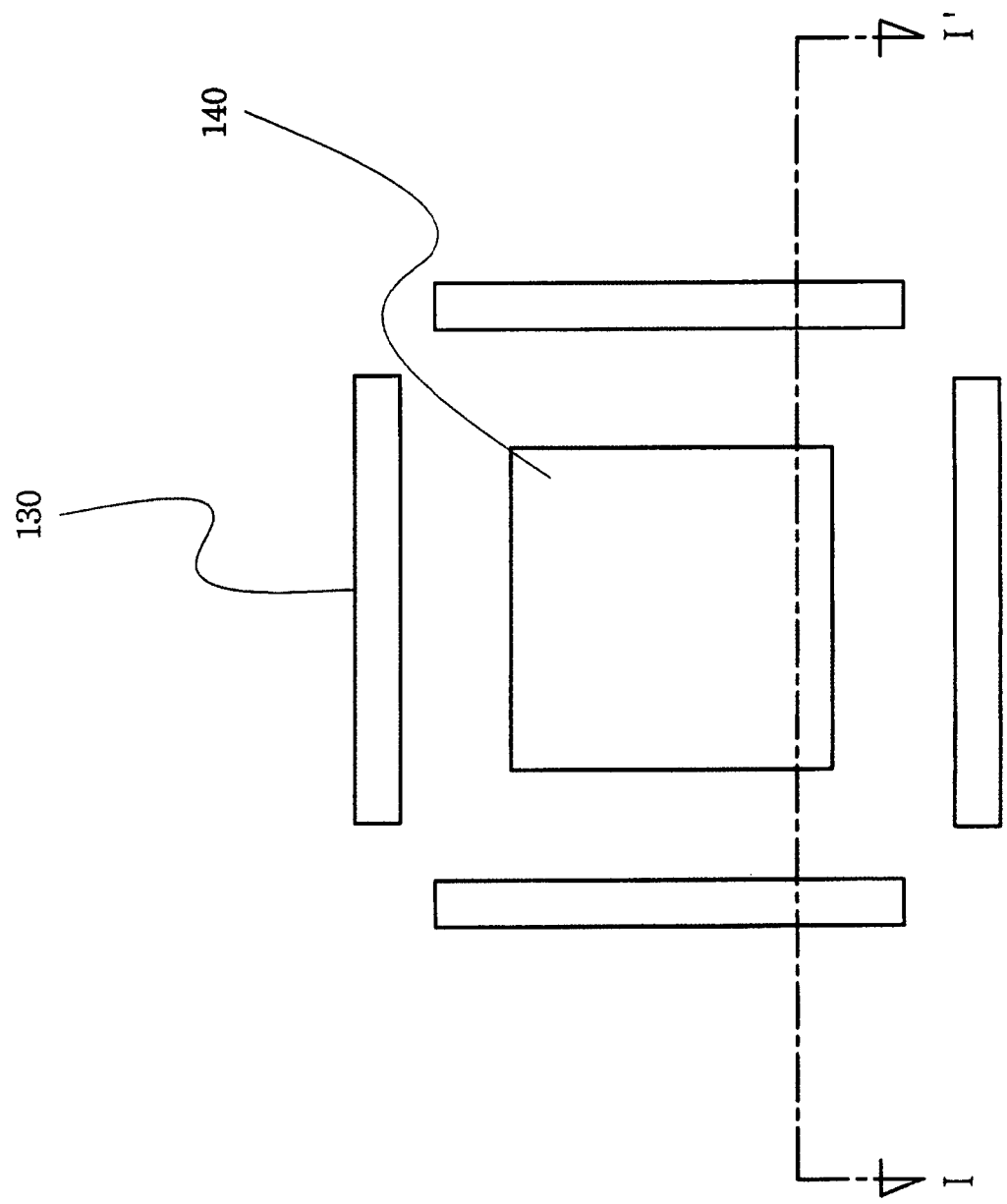
FIG. 3 is a plan view illustrating an overlay pattern.
Figure 4:
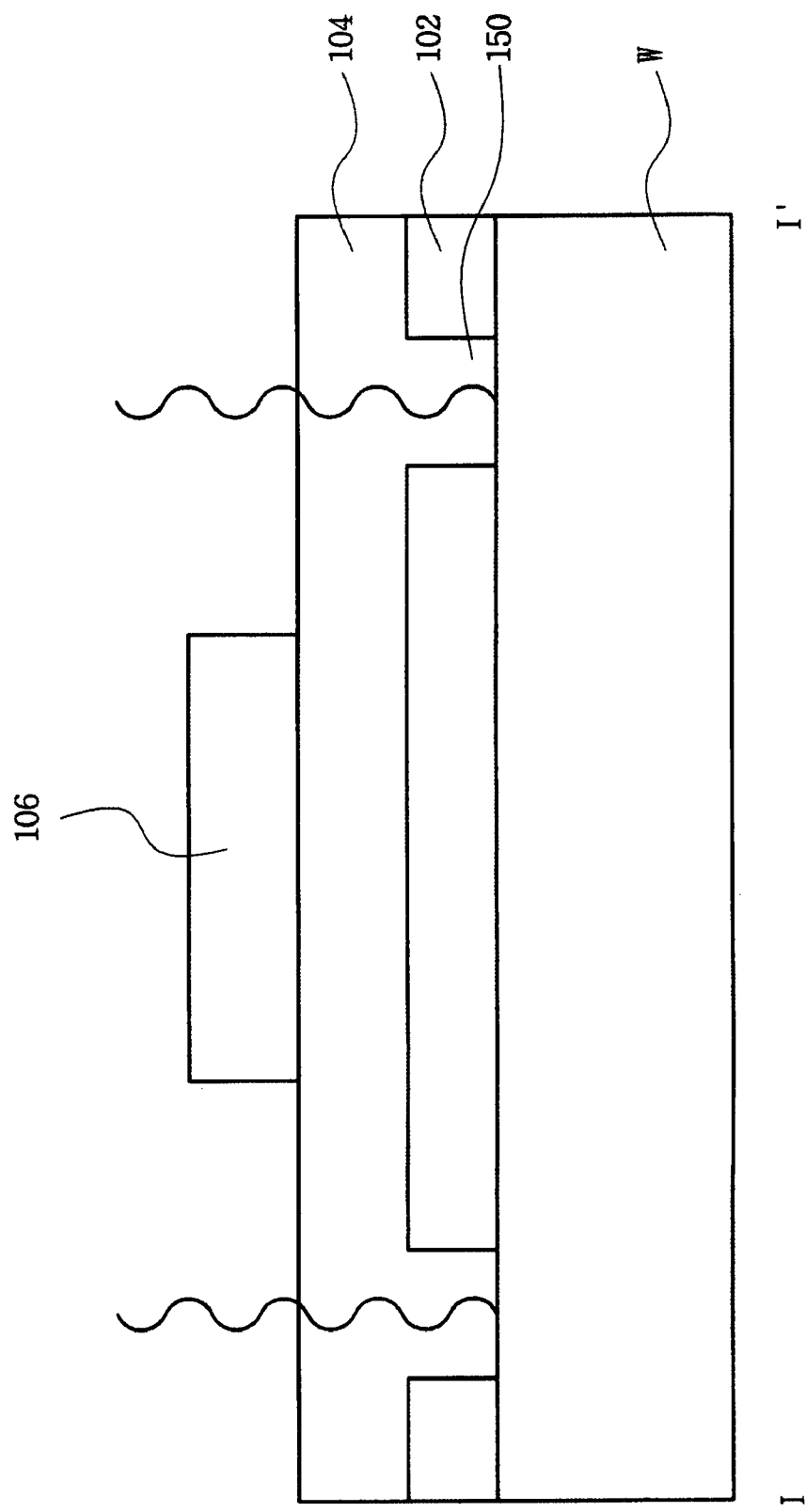
FIG. 4 is a cross-sectional view taken along line I-I' of FIG. 3.

FIG. 1 illustrates a diagram of an overlay measuring apparatus according to an exemplary disclosed embodiment. FIG. 2 illustrates an optical module 200 of FIG. 1. FIG. 3 illustrates a plan view of an overlay pattern. FIG. 4 is a cross-sectional view taken along line I-I' of FIG. 3.

As shown in FIG. 1, the overlay measuring apparatus includes a light source 100, an optical module 200, a wafer stage WS, an imaging unit 300, a database 400, a selection unit 500, a control unit 600, and a reading unit 700. The light source 100 generates white visible light having different wavelengths. The optical module 200 receives this light having different wavelengths and processes the received light such that the light has a single wavelength. This processed light which now has a single wavelength is then incident on a plurality of overlay patterns (for example, a main pattern 130 and a sub pattern 140 of FIG. 3) formed on a surface of a wafer W (the wafer stage WS supports the wafer W). Furthermore, the optical module 200 projects the overlay patterns. In addition, the imaging unit 300 captures the projected overlay patterns in accordance with the wavelength of the visible light. Furthermore, the image unit 300 also acquires image signals corresponding to the plurality of overlay patterns based on the wavelength of the visible light. These captured image signals are provided to the database 400, which sequentially stores the acquired image signals. Moreover, the selection unit 500 selects a clear image from the overlay pattern images stored in the database 400 by using the image signals acquired by the imaging unit 300. The control unit 600 outputs a control signal to the optical module 200 to acquire the clear overlay pattern image so that visible light with a single wavelength is selected from the white visible light generated by the light source 100 and is incident on the overlay patterns. In addition, the reading unit 700 reads any misalignment in the overlay patterns.

Although not shown, the overlay measuring apparatus may further include a display unit which displays the overlay pattern images from the image signals stored in the database 400 and displays the overlay pattern images selected by the selection unit 500.

The light source 100 generates white visible incoherent light with a predetermined intensity that is proportional to voltage supplied from the external or a power supply. To this end, the light source includes a lamp 110 and a reflective shade 120. The lamp 110 may be a xenon lamp or halogen lamp. The xenon lamp is an intense source of ultraviolet, visible and near-infrared light produced by electrical discharge in xenon under high pressure. The halogen lamp is a form of incandescent light bulb, in which halogen is injected to a glass bulb to prevent tungsten from evaporating. In particular, the halogen lamp includes halogen such as bromine or iodine to prevent a tungsten filament from evaporating. Specifically, the halogen injected in the glass bulb combines with tungsten evaporated from the filament. Furthermore, the combined substance collides with the filament and is decomposed due to heat resulting from the collision with the filament. At this time, the tungsten combines with the filament, and the halogen combines with tungsten evaporated from the filament. Through such a process, the filament in the halogen lamp can endure higher temperatures than that of the incandescent light bulb. Accordingly, the halogen lamp can emit a brighter light and have a longer life than the incandescent light bulb. For example, the life of the halogen lamp is typically two to three times that of the incandescent light bulb.

In addition, unlike the incandescent light bulb, because the halogen lamp does not darken with age, a decrease in its light flux may be no more than 7%. Furthermore, the halogen lamp has low power consumption and generates colors as clear as natural light. Accordingly, the light source 100 generates white visible light with different wavelengths of a predetermined intensity using voltage applied from the external or a power supply. The light source 100 may further include the reflective shade 120 to focus the light on the optical module 200.

The optical module 200 makes the white visible light generated by the light source 100 incident on the wafer W. In addition, the optical module 200 magnifies and projects a plurality of overlay patterns formed on the wafer W, and transmits the projected overlay patterns to the imaging unit 300. In an exemplary embodiment, the optical module 200 includes a first reflective mirror 210, a filter 220, an optical fiber 230, a first beam splitter 240, and a projection unit 250. The first reflective mirror 210 reflects the visible light generated by the light source 100. The filter 220 filters the visible light with various kinds of wavelengths reflected by the first reflective mirror 210 to select visible light with a single wavelength. The optical fiber 230 provides a transmission path for the visible light filtered by the filter 220. The first beam splitter 240 divides the visible light emitted from the optical fiber 230. The projection unit 250 magnifies and projects the visible light divided by the first beam splitter 240 onto the wafer W, and magnifies and projects visible light reflected from the wafer W onto the imaging unit 300.

The first reflective mirror 210 is used to reflect the visible light. In an exemplary embodiment, the first reflective mirror 210 is made by polishing a surface of glass or metal, or by depositing silver, aluminum, gold, zinc sulfide or rhodium on the surface of glass or metal. Examples of the first reflective mirror 210 include a plane mirror, a spherical mirror such as a convex or concave mirror, and a non-spherical mirror such as a paraboloidal mirror.

The filter 220 sorts out electromagnetic waves containing the visible light based on wavelength and transmits an electromagnetic wave with a predetermined wavelength. The filter 220 may also be called a color filter because it filters visible light. Examples of the color filter include a gelatin filter, a glass filter, and a plastic filter. Specifically, the gelatin filter is made of dyes extracted from proteins of animals and plants. On the other hand, the glass filter is made of a colored heat-resistant glass and is called a slide glass filter. While the glass filter is not easily discolored and may be cleaned well, the glass filter is also heavy and fragile. The plastic filter has good transmission capabilities and is easily colored. These features make the plastic filter widely usable as a color filter.

The visible light is an electromagnetic wave with a wavelength of about 7000 to 4000 Å. Furthermore, the visible light is white light because it includes a mixture of various colors such as red, orange, yellow, green, blue, indigo, and violet. Furthermore, each color corresponds to a different wavelength. Moreover, the filter 200 selects a single wavelength from the different wavelengths included in the visible light and makes the visible light with a single wavelength incident on the wafer W. To this end, the filter 220 can respond to a control signal outputted from the control unit 600 so that visible light with a single wavelength can be selected from the visible light with wavelengths of about 7000 to 4000 Å. For example, the filter 220 moves up and down according to the control signal outputted from the control unit 600 to select visible light with a particular wavelength from the various wavelengths included in the visible light. In addition, the filter 220 makes this visible light that now includes only the particular wavelength selected, incident on the first beam splitter 240.

In addition to the vertical movement, the filter 220 may also rotate in a direction according to the control signal outputted from the control unit 600 to select visible light with a particular wavelength from the various wavelengths included in the visible light and make the light with the selected wavelength incident on the first beam splitter 240.

The optical fiber 230 is a light-guide pipe that is used primarily to improve the transmission efficiency of the visible light. An optical cable is typically produced by stranding pieces of optical fibers. For example, the optical fiber 230 may be made of synthetic resin or may be made of transparent glass. Furthermore, the optical fiber 230 is composed of a denser core surrounded by a cladding layer. In addition, the optical fiber 230 is covered with a synthetic resin with one layer or two layers to prevent damages from outside. Typically, the optical fiber 230 has a diameter of several to hundreds of micrometers (μm) except the synthetic resin. Furthermore, because the core has a higher refractive index than the cladding layer, the visible light propagates well without departing from the core.

The optical fiber 230 may be a single-mode fiber or a multi mode fiber. A single-mode fiber has a core diameter of several micrometers, and a multi-mode fiber is manufactured with a core diameter of tens of micrometers. Furthermore, the fiber is divided into a step-index fiber and a graded-index fiber according to a distribution pattern of the refractive index. In addition, the optical fiber 230 is not affected by interferences of external electromagnetic waves and is resistant to a change in external environment. Furthermore, it is small-sized and light-weighted. In an exemplary embodiment, the optical module 200 may further include a focusing lens 260 that focuses the visible light towards the first beam splitter 240 by preventing the visible light emitted from the optical fiber 230 from being scattered in a radial pattern.

The first beam splitter 240 splits the visible light emitted from the optical fiber 230 and focused by the focusing lens 260 into at least two light components according to the intensity of the visible light. For example, the first beam splitter 240 includes a half mirror that transmits a half of the visible light in its propagating direction, and reflects the other half of the visible light in a direction perpendicular to the propagating direction. Furthermore, the half of the visible light passing through the half mirror in the direction of its propagation is reflected back by a reference lens 256 and a reference reflective mirror 258 to the first beam splitter 240. This half of the visible light that is fed back to the first beam splitter 240 is incident on the wafer W and has an interference effect on the visible light incident on the wafer W. Furthermore, because this half of the visible light is reflected towards the first beam splitter 240, it amplifies the visible light reflected on a plurality of overlay patterns formed on the wafer W. Moreover, the first beam splitter 240 is designed to transmit visible light that is reflected from the overlay patterns formed on the wafer W and propagate the reflected light towards the imaging unit 300.

On the other hand, the other half of the visible light reflected by the first beam splitter 240 (the half of the visible light transmitted in a direction perpendicular to the propagating direction) is magnified and projected by the projection unit 250 on the wafer W. In an exemplary embodiment, the projection unit 250 includes at least a main objective lens 252 which reduces the visible light transmitted from the light-guide pipe and makes it incident on the overlay patterns formed on the wafer W, and an ocular lens 254 which uses the visible light incident on the wafer W through the main objective lens 252 and reflected by the wafer W, to magnify the overlay patterns.

In an exemplary embodiment, the main objective lens 252 is located most closely to the wafer W. Furthermore, the main objective lens 252 magnifies an image of an object that is located near the lens. In addition, the main objective lens consists of a number of lenses to compensate for aberrations. For example, an achromatic objective lens may be used for low magnifications because it does not need an accurate compensation for chromatic aberration. On the other hand, an apochromatic objective lens may be used for high magnifications because it needs an accurate compensation for chromatic aberration. Thus, in an exemplary embodiment, the main objective lens 252 consists of a plurality of apochromatic objective lenses on the wafer W on which the overlay patterns are formed.

In an exemplary embodiment, the ocular lens 254 is located closer to an observer or the imaging unit 300 as compared to the main objective lens 252. The ocular lens 254 magnifies an image formed on a cross line by the objective lens. The position of the ocular lens 254 which makes the image of the overlay pattern be viewed most clearly can be determined while the ocular lens 254 moves with respect to the main objective lens 252. Furthermore, the size of the image of the overlay pattern magnified by the projection unit 250 is determined by the product of magnification of the main objective lens 252 and magnification of the ocular lens 254. For example, the projection unit 250 is configured to magnify and project the surface of the wafer W to a size of 750, 150, or 50 μm.

As shown in FIG. 2, when distance L2 between the first beam splitter 240 and a reference reflective mirror 258 is equal or similar to distance L1 between the first beam splitter 240 and the wafer W, the visible light that is split by the first beam splitter 240 and propagated in a direction perpendicular to that of the light passing through the first beam splitter 240 and the visible light that is incident on the reference reflective mirror 258 may have a constructive interference effect on each other.

In an exemplary embodiment, the distance L2 is a fixed value. Specifically, this value is the sum of a horizontal distance Lr between a central line of the first beam splitter 240 and a housing 242 surrounding the first beam splitter 240 and a distance Lm between the housing 242 and the reference reflective mirror 258 (L2=Lr+Lm). Furthermore, the distance L1 is of a variable value, which is the sum of a vertical distance La between the first beam splitter 240 and the housing 242, a distance Lp between the housing 242 and an end of the main objective lens 252, and a distance Lf between the end of the main objective lens 252 and the wafer W (L1=La+Lp+Lf). In addition, the first beam splitter 240 may move up and down to adjust a height to the housing 242. For example, a distance which the first beam splitter 240 moves up and down may be indicated by 'P' value, which ranges 0 to 10 μm.

In an exemplary embodiment, a reference lens 256 and the reference reflective lens 258 are operatively connected to the first beam splitter 240 to move up and down. Furthermore, the distance between the housing 242 and the end of the main objective lens 252 is a fixed value. The distance between the end of the main objective lens 252 and the surface of the wafer W is a focal distance of the main objective lens 252. Furthermore, the focal distance of the main objective lens is dependent on the specification of the main objective lens 252. A proper focal distance for the main objective lens is important so that images of a plurality of overlay patterns formed on the wafer W can be accurately formed by the main objective lens 252. Therefore, the distance between the end of the main objective lens 252 and the surface of the wafer W is generally of a fixed value. Accordingly, the optical module 200 enables an accurate overlay measurement to be made when the distance between the first beam splitter 240 and the reference reflective mirror 258 and the distance between the first beam splitter 240 and the surface of the wafer W are the same or are similar to each other.

The visible light propagates from the first beam splitter 240 through the ocular lens 254 to the imaging unit 300. Although not shown, a second beam splitter, which splits the visible light based on the intensity of the visible light, and a detection unit, which detects the intensity of the visible light that is split by the second beam splitter, may be provided between the ocular lens 254 and the imaging unit 300. Specifically, the second beam splitter may be formed inside a mirror barrel adjacent to the imaging unit 300 to split the visible light. For example, similarly to the first beam splitter 240, the second beam splitter splits the visible light based on its intensity, in which it transmits part of the visible light and reflects the remaining part of the visible light towards the detection unit.

The detection unit may be a photo sensor that detects visible light incident from the second splitter based on the intensity of the visible light. After the visible light with a predetermined intensity that is supplied from the light source 100, is sorted out by the filter 220 and is incident on the surface of the wafer W, the visible light is reflected on the surface of the wafer W. At this time, the wavelength or frequency of the visible light is nearly unchanged, while its intensity may be significantly reduced. Accordingly, the detection unit detects the amplitude of the visible light corresponding to its intensity to determine the intensity of the visible light from the imaging unit 300. When the intensity of the visible light is high or low, the control unit 600 can control the voltage supplied to the light source 100 to adjust the intensity of the visible light.

The imaging unit 300 acquires images of the overlay patterns that are reflected on the wafer W and are magnified and projected by the main objective lens 252 and the ocular lens 254. In particular, the imaging unit 300 can acquire the images of the overlay patterns at a focal point of the main objective lens 252 and ocular lens 254. In an exemplary embodiment, the imaging unit 300 is an image sensor that detects information such as the images of the overlay patterns and converts it to an electrical image signal. In particular, the image sensor mainly consists of an imaging tube and a solid-state image sensor. Examples of the imaging tube include vidicon and plumbicon, and examples of the solid-state image sensor include a complementary metal-oxide-semiconductor (CMOS) image sensor and a charge-coupled device (CCD) image sensor. The solid-state image sensor is also called an imaging plate. Furthermore, the solid-state image sensor performs a light to electricity conversion function on a group of pixels arranged in two dimensions (or in one dimension) on a semiconductor substrate on which the visible light is incident. In addition, the solid-state image sensor performs a scanning function to read charge images accumulated on the pixels in a predetermined order. The semiconductor substrate is formed of almost a single-crystal silicon substrate, and the pixels are formed to have a matrix array on the semiconductor substrate. Accordingly, the solid-state image sensor sequentially scans the amount of charge of a pixel, and generates an output signal current. Furthermore, the solid-state image sensor uses a charge transmission method in which separated pixels are sequentially transmitted through a scanning signal generator. In an exemplary embodiment, the CMOS image sensor uses a metal oxide semiconductor transistor and the CCD image sensor uses a charge coupled device for signal transmission.

Accordingly, the imaging unit 300 can acquire high-resolution digital image signals by using the CCD or CMOS image sensor to obtain images of a plurality of overlay patterns that are magnified and projected by the optical module 200. Specifically, the imaging unit 300 acquires a plurality of image signals that correspond to a visible light with a single wavelength obtained by the filter 220. For example, when red light with a wavelength of about 7000 Å is selected by the filter 220, image signals containing a plurality of overlay patterns on the surface of the wafer W that are indicated by the red light are output. In addition, when blue light with a wavelength of about 5000 Å is selected by the filter 220, image signals containing a plurality of overlay patterns on the surface of the wafer W that are indicated by the blue light are output.

The database 400 receives the image signals containing a plurality of overlay patterns outputted from the imaging unit 300 and sequentially stores these images. The database 400 refers to a set of information that is collectively managed to be shared. Furthermore, the database 400 stores these images in a manner such that their retrieval and update may be performed efficiently. In an exemplary embodiment, the database 400 may have features such as the following: (1) The ability to distinguish between similar looking images; (2) The ability to be accessed by computers and be sequentially written to; and (3) The ability to compare the overlay patterns indicated by a plurality of images with one another. In addition, the database 400 receives from the control unit 600, information about the wavelength of the visible light selected by the filter 220 and stores this information together with the image signals outputted from the imaging unit 300. This storage of the wavelength information along with the image signals may permit the selection unit 500 to determine whether or not the overlay pattern image acquired by the imaging unit 300 is projected by the visible light with the single wavelength selected by the filter 220.

The selection unit 500 can represent a plurality of overlay patterns through a plurality of images using the image signals stored in the database 400. In addition, the selection unit 500 can also compare a plurality of overlay patterns represented by individual images with one another to select the clearest image. As shown in FIG. 3, in an exemplary embodiment, the plurality of overlay patterns includes a main pattern 130 that is formed on the wafer W by a preceding process, and a sub pattern 140 that is formed inside the main pattern 130 or formed to surround the outside of the main pattern 130 by a subsequent process. For example, the main pattern 130 may be formed by a preceding process to have a step from the surface of the wafer W and may be formed by a plurality of bars surrounding the outside of a square. In this case, the sub pattern 140 is formed inside the main pattern 130 by a subsequent process in also a square shape whose sides are shorter than those of the main pattern 130.

As shown in FIG. 4, the main pattern 130 is formed in a trench (reference numeral 150 of FIG. 4) with a predetermined line width, or in bar shape on a first thin film 102. The first thin film 102 may be a film such as an interlayer insulation film, such as a silicon oxide film, or a conductive layer, such as a poly silicon film doped with conductive impurity. In this case, the above-mentioned unit process includes a photolithographic process to form a photoresist pattern on the wafer W or the first thin film 102 formed on the wafer W. It may also include an etching process to form the trench 150 or bar by eliminating portions of the wafer W exposed by the photoresist pattern formed by the photolithographic process or eliminating the first thin film 102 formed on the wafer W. In addition, the unit process may also include an ashing process to eliminate the wafer W or the photoresist pattern formed on the wafer W.

Subsequently, an interlayer insulation film with a predetermined thickness and a second thin film 104 formed of a metal layer are formed on the wafer W, on which the main pattern 130 is formed. In addition, a photoresist 106 with a predetermined thickness is formed on the second thin film 104. Furthermore, the sub pattern 140 is formed by patterning the photoresist 106 in a square shape such that it is positioned in a region surrounded by the main patterns 130 as seen in a plan view.

Typically, the visible light may be refracted or scattered on the trench 150, causing an image of the main pattern 130 to be distorted. Furthermore, when visible light with a specific wavelength is incident on the main pattern 130, the visible light may be refracted or scattered. Specifically, the visible light is refracted or scattered in direct proportion to wavelength of the visible light and in inverse proportion to line width of the main pattern 130. That is, the longer the wavelength of the visible light, the more the visible light is refracted or scattered. In addition, the shorter the line width of the main pattern 130, the more the visible light is refracted or scattered. Accordingly, the amount of visible light refracted or scattered may be lessened by reducing the wavelength of the visible light and increasing the line width of the main pattern 130. However, reducing the wavelength may lead to undesirable consequences. For example, when the wavelength of the visible light is reduced to a range of ultraviolet light, the photoresist 106 constituting the sub pattern 140 is exposed to light, resulting in a change in the chemical composition of the photoresist. In addition, due to the damaged photoresist 106, defective etching may occur in the etching process in which the photoresist 106 is used as an etching mask.

Increasing the line width of the main pattern 130 may also lead to undesirable consequences. For example, when the line width of the main pattern 130 becomes large, it may be different from the size of a minute pattern formed in an active area or cell area of the wafer W, such that it may be difficult to calculate overlay compensation values.

In an exemplary embodiment, the selection unit 500 selects the best possible image of the main pattern 130. This selection is made by comparing images of the main pattern 130 with others from among a plurality of overlay pattern images that are acquired by the imaging unit 300 using visible light with various wavelengths. Because the plurality of overlay pattern images may have different colors, the selection unit 500 processes the images such that the entire image of the main pattern 130 is represented in black and white. The selection unit 500 then compares the images of the main pattern 130 that are now in black and white with one another. Accordingly, even though some of the images of the main pattern 130 are damaged due to the refraction or scattering of the visible light, the selection unit 500 can compare the images of the main pattern 130 with one another and select at least one good image of the main pattern 130 that is not damaged due to the refraction or scattering of the visible light. In addition, the selection unit 500 acquires information regarding the wavelength of visible light that is used when the imaging unit 300 acquires the overlay pattern image, and outputs this information to the control unit 600.

The control unit 600 receives from the filter 220 of the optical module 200, the information concerning a single wavelength of the visible light selected by the filter 220. Furthermore, the control unit 600 outputs the information to the database 400. In addition, the control unit 600 receives from the selection unit 500, the information about the wavelength of visible light that is used when the overlay pattern image selected by the selection unit 500 is projected. In addition, the control unit 600 outputs a control signal to control the filter 220 so that the visible light with the corresponding unit wavelength can be selected by the filter 220 to make an overlay measurement. For example, the control unit 600 can output the control signal such that the filter 220 can select visible light with a plurality of unit wavelengths while moving back and forth on a straight line or rotating in any direction.

The reading unit 700 measures a deviation between a central position of the image of the main pattern 130 selected by the selection unit 500 and a central position of the image of the sub pattern 140 and calculates an overlay compensation value. For example, the reading unit 700 represents the image of the main pattern 130 on X-axis and Y-axis, calculates a central position between a plurality of bars perpendicular to the X-axis and a central position between a plurality of bars perpendicular to the Y-axis; and thus acquires central positions of the image of the main pattern 130 on X-axis and Y-axis. Similarly, the reading unit 700 calculates central positions of sides of the square forming the sub pattern 140 on X-axis and Y-axis. Moreover, the reading unit 700 compares the central position of the image of the main pattern 130 and the central position of the sub pattern 140 to calculate the overlay compensation value. In an exemplary embodiment, the overlay compensation value represents a deviation of the sub pattern 140 from the main pattern 130 in X-axis and Y-axis. For example, when the central position of the image of the main pattern 130 and the central position of the sub pattern 140 match each other, the overlay compensation value is equal to '0'. In addition, the overlay compensation value may be calculated by calculating differences in positions between a plurality of main patterns 130 formed on the wafer W and a plurality of sub patterns 140 formed adjacent to the main patterns 130, and averaging the differences in positions.

In an exemplary embodiment, the overlay measuring apparatus includes the optical module 200, the imaging unit 300, the selection unit 500, and the control unit 600. As described above, the control unit 600 outputs a control signal to the optical module 200. This control signal allows the optical module 200 to project the overlay pattern with a specific color using the information concerning the wavelength of the visible light used to acquire the overly pattern image selected by the selection unit 500. Accordingly, it may be possible to prevent errors in overlay measurement which are generated due to the refraction or scattering of the visible light with a specific wavelength on the overlay patterns. As a result, it may be possible to increase or maximize the yield rate during the fabrication process.

Figure 5:
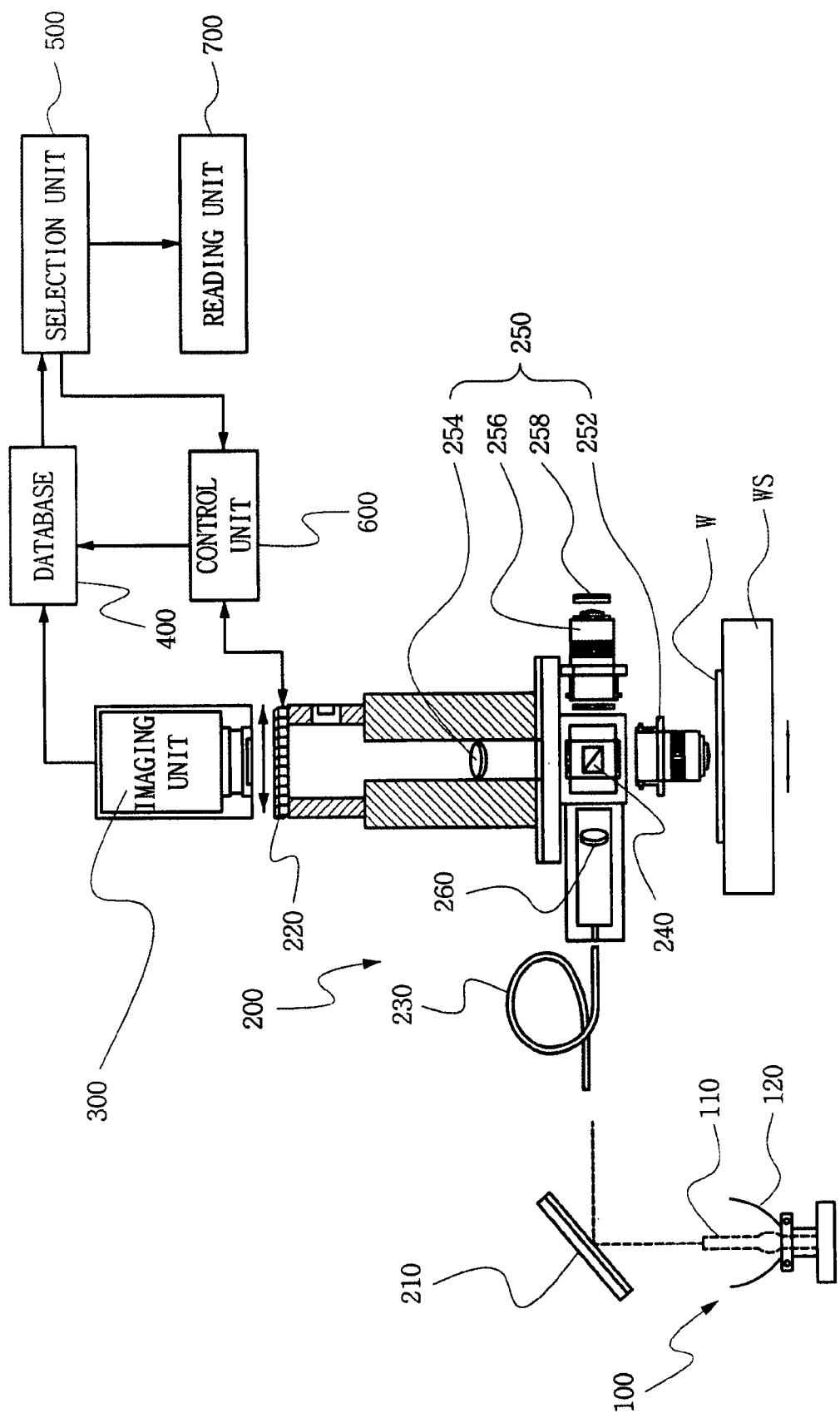
FIG. 5 illustrates a diagram of an overlay measuring apparatus according to an alternative exemplary disclosed embodiment.
Figure 6:
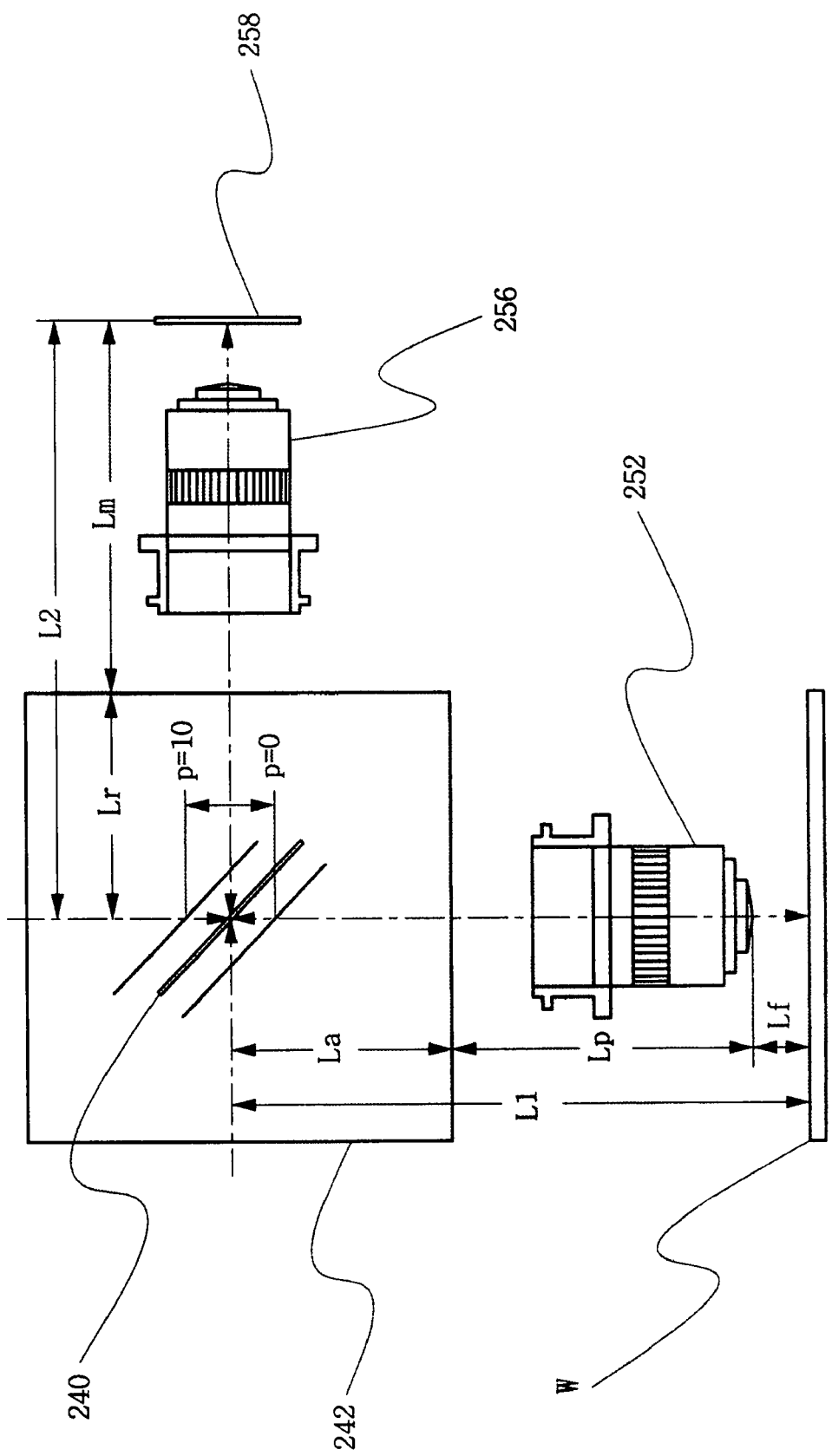
FIG. 6 illustrates an optical module of FIG. 5.
Figure 7:
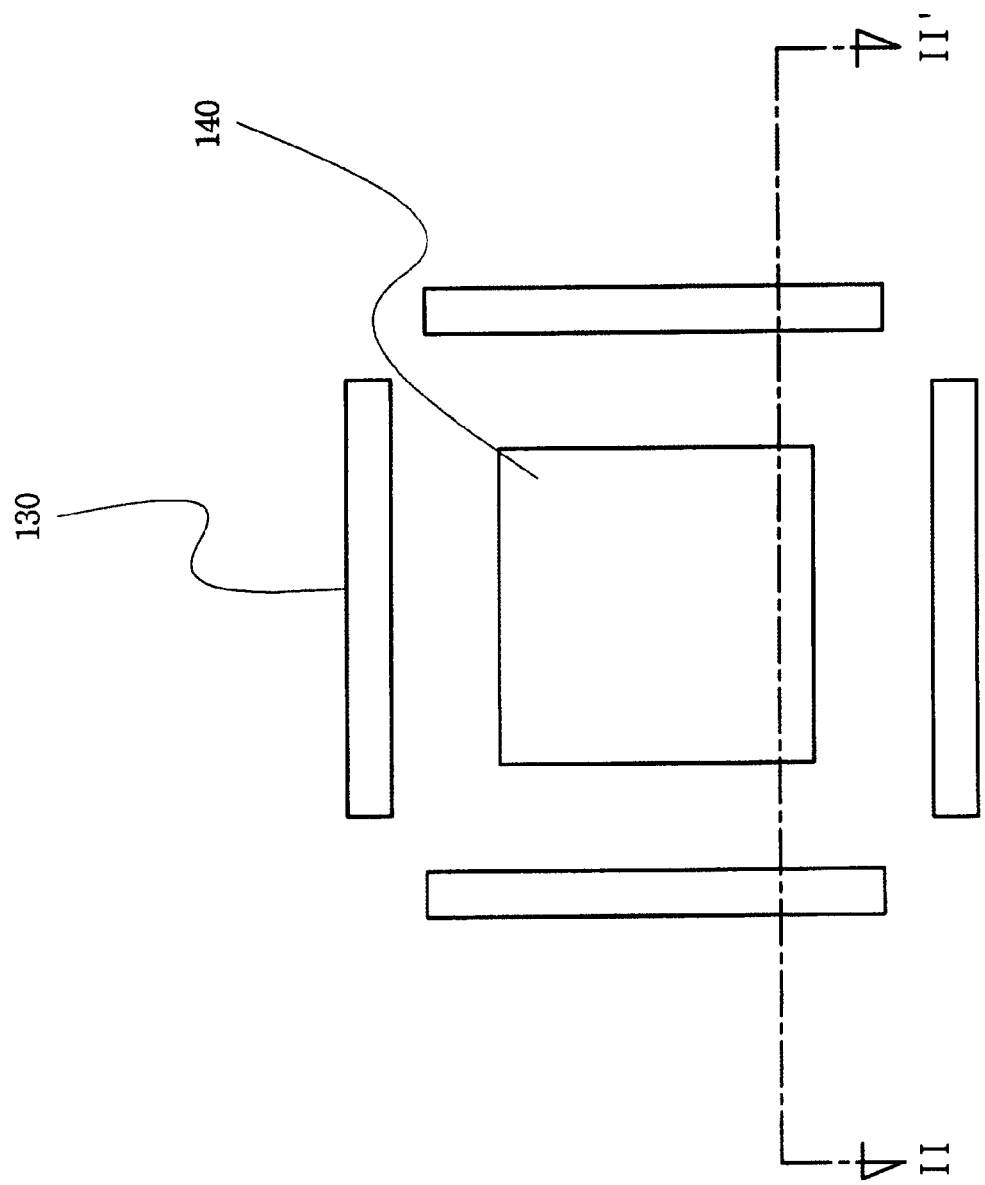
FIG. 7 is a plan view illustrating an overlay pattern.
Figure 8:
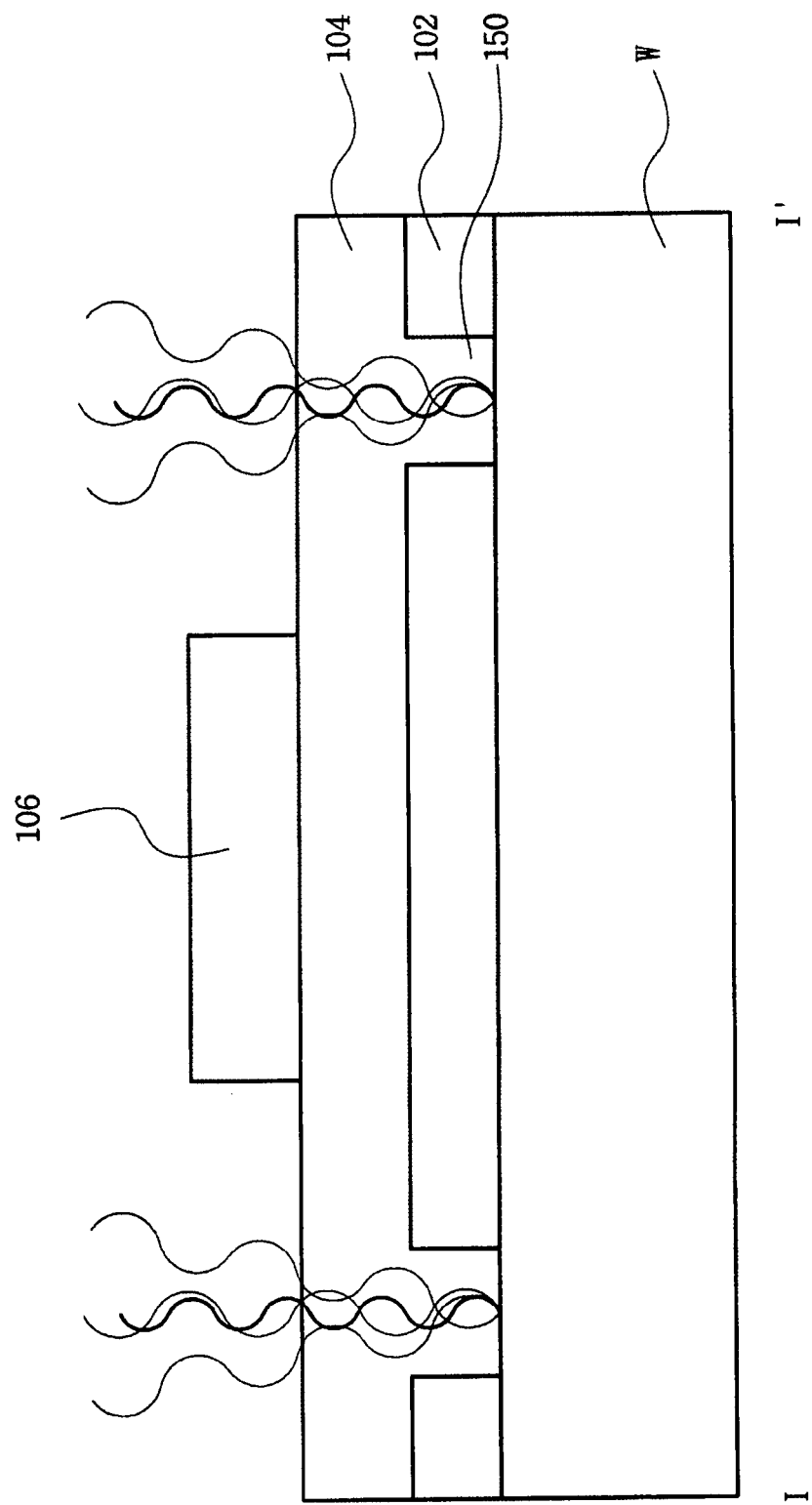
FIG. 8 is a cross-sectional view taken along line II-II' of FIG. 7.

FIG. 5 illustrates a diagram of an overlay measuring apparatus according to an alternative exemplary disclosed embodiment. FIG. 6 illustrates an optical module 200 of FIG. 5. FIG. 7 illustrates a plan view of an overlay pattern. FIG. 8 is a cross-sectional view taken along line II-II' of FIG. 7. In the embodiment discussed below, the elements that are the same as those described in previously discussed embodiments are denoted by the same reference numerals as those provided in the previously discussed embodiments. As shown in FIG. 5, the overlay measuring apparatus includes a light source 100, an optical module 200, a wafer stage WS, an imaging unit 300, a database 400, a selection unit 500, a control unit 600, and a reading unit 700. The light source 100 generates white visible light that may have different wavelengths. Furthermore, the optical module 200 makes the visible light generated by the light source 100 incident on a plurality of overlay patterns (e.g., a main pattern 130 and a sub pattern 140 in FIG. 7). In addition, the optical module 200 selects a predetermined unit wavelength of the visible light reflected on the plurality of overlay patterns. Furthermore, the wafer stage WS supports the wafer W on which the plurality of overlay patterns are formed.

The imaging unit 300 acquires image signals that include images of the plurality of overlay patterns. Furthermore, the database 400 sequentially stores the image signals acquired by the imaging unit 300. In addition, the selection unit 500 selects a clear image from among the plurality of images stored in the database 400. Furthermore, the control unit 600 outputs a control signal to the optical module 200. This control signal may be used to acquire a clear overlay pattern image. Specifically, the image is acquired in such a manner that visible light with a single wavelength is selected from the white visible light that is incident on the overlay patterns. Furthermore, the overlay pattern image that has a predetermined color based on the selected single wavelength is acquired by the imaging unit 300. In addition, the reading unit 700 reads misalignment in the overlay patterns.

Although not shown, the overlay measuring apparatus may further include a display unit which displays the overlay pattern images from the image signals stored in the database 400. Furthermore, the display unit may also display the overlay pattern images selected by the selection unit 500.

In an exemplary embodiment, the light source 100 generates white visible light. This light is generally incoherent and has a predetermined intensity that is proportional to a voltage supplied from the external or a power supply. For example, the light source 100 includes a lamp 110 such as, for example, a xenon lamp, or halogen lamp. The xenon lamp is an intense source of ultraviolet, visible and near-infrared light produced by electrical discharge in xenon under high pressure. The halogen lamp is an incandescent light bulb, in which halogen is injected to a glass bulb to suppress tungsten from evaporating. The halogen lamp contains halogen such as bromine or iodine to further suppress a tungsten filament from evaporating. Specifically, the halogen injected in the glass bulb combines with tungsten evaporated from the filament. Furthermore, the combined substance collides with the filament and is decomposed due to heat resulting from the collision with the filament. At this time, the tungsten combines with the filament, and the halogen combines with tungsten evaporated from the filament. Through such a process, the filament in the halogen lamp can endure higher temperatures than that of the incandescent light bulb. Therefore, the halogen lamp can emit a brighter light and have a longer life than the incandescent light bulb. In particular, the life of the halogen lamp is two to three times that of the incandescent light bulb.

In addition, unlike the incandescent light bulb, because the halogen lamp does not darken with age, a decrease in its light flux may be no more than 7%. Furthermore, the halogen lamp has low power consumption and generates colors as clear as natural light. Accordingly, the light source 100 generates white visible light with different wavelengths of a predetermined intensity using voltage applied from the external or a power supply. Furthermore, the light source 100 may also include a reflective shade 120 to focus the light on the optical module 200.

The optical module 200 makes the white visible light with various wavelengths that is generated by the light source 100 incident on the wafer W. In addition, the optical module 200 magnifies and projects a plurality of overlay patterns formed on the wafer W, selects visible light with a single wavelength from the visible light with various wavelengths projected on the overlay patterns, and transmits the visible light with a single wavelength to the imaging unit 300.

In an exemplary embodiment, the optical module 200 includes a first reflective mirror 210, a filter 220, an optical fiber 230, a first beam splitter 240, and a projection unit 250. The first reflective mirror 210 reflects the visible light generated by the light source 100. The optical fiber 230 changes a transmission path of the visible light reflected by the first reflective mirror 210. The first beam splitter 240 divides the visible light emitted from the optical fiber 230. The projection unit 250 magnifies and projects the visible light divided by the first beam splitter 240 onto the wafer W, and magnifies and projects visible light reflected on the wafer W onto the imaging unit 300. The filter 220 selects the visible light with a single wavelength from the visible light with various wavelengths projected by the projection unit 250 and transmits the visible light with a single wavelength to the imaging unit 300.

The first reflective mirror 210 is used to reflect the visible light. In an exemplary embodiment, the first reflective mirror 220 is made by polishing a surface of glass or metal, or by depositing silver, aluminum, gold, zinc sulfide or rhodium on the surface of glass or metal. Examples of the first reflective mirror 210 include a plane mirror, a spherical mirror such as a convex or concave mirror, and a non-spherical mirror such as a paraboloidal mirror.

The optical fiber 230 is a fiber-shaped light-guide pipe that may improve the transmission efficiency of the visible light. An optical cable is produced by stranding pieces of optical fibers. For example, the optical fiber 230 may be made of synthetic resin but is mainly made of transparent glass. In particular, the optical fiber 230 is composed of a denser core surrounded by a cladding layer. In particular, the denser core is covered with a synthetic resin to prevent damages from outside. Furthermore, the denser core has a diameter of several to hundreds of micrometers except the synthetic resin. Because the core has a higher refractive index than the cladding layer, the visible light propagates well without departing from the core.

In an exemplary embodiment, the optical fiber 230 may be a single-mode fiber or a multi-mode fiber. A single-mode fiber has a core diameter of several micrometers, and a multi-mode fiber is manufactured with a core diameter of tens of micrometers. Furthermore, the optical fiber 230 is divided into a step-index fiber and a graded-index fiber according to a distribution pattern of the refractive index. The optical fiber 230 has several important features. For example, the optical fiber 230 is not affected by interferences of external electromagnetic waves and is resistant to a change in external environment. In addition, it is small-sized and light-weighted. In an exemplary embodiment, the optical module 200 may further include a focusing lens 260. The focusing lens 260 focuses the visible light towards the first beam splitter 240 by preventing the visible light emitted from the optical fiber 230 from being scattered in a radial pattern.

The first beam splitter 240 splits the visible light emitted from the optical fiber 230 and focused by the focusing lens 260 into at least two light components. This splitting may be based on the intensity of the visible light. For example, the first beam splitter 240 includes a half mirror that transmits a half of the visible light in its propagating direction, and reflects the other half of the visible light in a direction perpendicular to the propagating direction. The portion of the visible light passing through the half mirror is reflected by a reference lens 256 and a reference reflective mirror 258 and is fed back to the first beam splitter 240. This portion of the visible light that is fed back to the first beam splitter 240 is incident on the wafer W and has an interference effect on the visible light incident on the wafer W and reflected towards the first beam splitter 240. This interference effect amplifies the visible light reflected on a plurality of overlay patterns formed on the wafer W. Furthermore, the first beam splitter 240 is designed to propagate visible light that is reflected on the overlay patterns formed on the wafer W towards the imaging unit 300.

On the other hand, the other half of the visible light reflected by the first beam splitter 240 is magnified and projected by the projection unit 250 on the wafer W. To this end, the projection unit 250 includes at least a main objective lens 252, which reduces the visible light transmitted from the light-guide pipe and makes it incident on the overlay patterns formed on the wafer W, and an ocular lens 254, which uses the visible light incident on the wafer W through the main objective lens 252 and reflected by the wafer W to magnify the overlay patterns.

The main objective lens 252 is located close to the wafer W to form an image of an object. Furthermore, the objective lens 252 magnifies an image of an object that is closely located, and consists of a number of lenses to compensate for aberrations. For example, an achromatic objective lens is used for low magnifications because it does not need an accurate compensation of chromatic aberration. On the other hand, an apochromatic objective lens is used for high magnifications because it needs an accurate compensation of chromatic aberration.

In an exemplary embodiment, the main objective lens 252 includes a plurality of apochromatic objective lenses. In addition, the ocular lens 254 is located closely to an observer or the imaging unit 300. The ocular lens 254 magnifies an image formed on a cross line by the objective lens. The position of the ocular lens 254 which makes the image of the overlay pattern be viewed most clearly can be determined while the ocular lens 254 moves with respect to the main objective lens 252. The projection unit 250 magnifies the overlay pattern. Specifically, the size of the image of the overlay pattern magnified by the projection unit 250 is determined by the product of magnification of the main objective lens 252 and magnification of the ocular lens 254. For example, the projection unit 250 is configured to magnify and project the surface of the wafer W to a size of 750, 150, or 50 μm.

As shown in FIG. 6, when distance L2 between the first beam splitter 240 and the reference reflective mirror 258 is equal or similar to distance L1 between the first beam splitter 240 and the wafer W, the visible light, which has been incident on and reflected from the reference reflective mirror 258, and the visible light, which has been incident on and reflected from the wafer W, may have a constructive interference effect on each other. Furthermore, visible light reflected by the reference reflective mirror 258 and the wafer W may be transmitted to the imaging unit 300.

The distance L2 is a fixed value, which is the sum of a horizontal distance Lr between a central line of the first beam splitter 240 and a housing 242 surrounding the first beam splitter 240, and distance Lm between the housing 242 and the reference reflective mirror 258 (i.e., L2=Lr+Lm).

The distance L1 is a variable value, which is the sum of a vertical distance La between the first beam splitter 240 and the housing 242, distance Lp between the housing 242 and an end of the main objective lens 252, and distance Lf between the end of the main objective lens 252 and the wafer W (i.e., L1=La+Lp+Lf). The first beam splitter 240 may move up and down to adjust a height to the housing 242. For example, a distance which the first beam splitter 240 moves up and down may be indicated by 'P' value, which may range from 0 to 10 μm. In addition, the reference lens 256 and the reference reflective lens 258 are operatively connected to the first beam splitter 240 to move up and down.

In an exemplary embodiment, the distance between the housing 242 and the end of the main objective lens 252 is a fixed value. Furthermore, the distance between the end of the main objective lens 252 and the surface of the wafer W is a focal distance of the main objective lens 252. In addition, this distance is dependent on the specification of the main objective lens 252. Therefore, in order that images of a plurality of overlay patterns formed on the wafer W may be accurately captured by the main objective lens 252, the distance between the end of the main objective lens 252 and the surface of the wafer W is a fixed value. Accordingly, the optical module 200 enables an accurate overlay measurement to be made when the distance between the first beam splitter 240 and the reference reflective mirror 258 and the distance between the first beam splitter 240 and the surface of the wafer W are the same or are similar to each other.

In an exemplary embodiment, after the visible light reflected on the surface of the wafer W is combined with visible light reflected from the reference reflective mirror on the first beam splitter, the combined visible light is reflected towards the ocular lens 254. Although not shown, a second beam splitter, which splits the visible light based on the intensity of the visible light, and a detection unit, which detects the intensity of the visible light that is split by the second beam splitter, may be provided between the ocular lens 254 and the imaging unit 300. In particular, the second beam splitter may be formed inside a mirror barrel adjacent to the imaging unit 300 to split the visible light. For example, similarly to the first beam splitter 240, the second beam splitter splits the visible light based on its intensity, in which it transmits part of the visible light and reflects the remaining part of the visible light towards the detection unit.

In an exemplary embodiment, the detection unit is a photosensor that detects visible light incident from the second splitter. After the visible light with a predetermined intensity that is supplied from the light source 100 is sorted out by the filter 200 and is incident on the surface of the wafer W, the visible light is reflected on the surface of the wafer W. At this time, the wavelength or frequency of the visible light is nearly unchanged, while its intensity may be significantly reduced. Accordingly, the detection unit detects the amplitude of the visible light corresponding to its intensity to determine the intensity of the visible light from the imaging unit 300. When the intensity of the visible light is high or low, the control unit 600 can control the voltage supplied to the light source 100 to adjust the intensity of the visible light.

When the visible light with various wavelengths are emitted through the ocular lens 254, the filter 220 selects a single wavelength of the visible light from them and applies the visible light with a single wavelength to the imaging unit 300. Specifically, the filter 220 sorts out electromagnetic waves containing the visible light based on wavelength and transmits an electromagnetic wave with a predetermined wavelength. In an exemplary embodiment, the filter 220 is called a color filter.

The color filter 220 may be made of different materials. For example, the color filter may be manufactured with glass, gelatin or plastic that contains dyes. Furthermore, with the use of several color filters, a light-transmission area as narrow as that of a band filter can be formed. Examples of the color filter include a gelatin filter, a glass filter and a plastic filter. Typically, the gelatin filter is made of dyes extracted from proteins of animals and plants. On the other hand, the glass filter is generally made of a colored heat-resistant glass and is called a slide glass filter. The glass filter has several features. For example, the glass filter is not easily discolored and may be cleaned well, but is generally heavy and fragile. Furthermore, the plastic filter has good transmittance characteristics and is easily colored, such that it is widely used as a color filter.

In an exemplary embodiment, the visible light is an electromagnetic wave with a wavelength of about 7000 to 4000 Å, and is white light made by mixing various colors such as, for example, red, orange, yellow, green, blue, indigo, and violet. Accordingly, the filter 200 selects visible light with a single wavelength selected from the white visible light with various kinds of wavelengths. Furthermore, the filter 220 makes the selected visible light with a single wavelength incident on the wafer W. Specifically, the filter 220 can respond to a control signal outputted from the control unit 600 such that visible light with a single wavelength can be selected from the visible light with wavelengths of about 7000 to 4000 Å. This may achieved by adjusting the position of the filter 220 in response to the control signal outputted from the control unit 600. For example, the filter 220 moves up and down according to the control signal outputted from the control unit 600 to select visible light with individual wavelengths from the white visible light that includes various wavelengths, and makes the visible light with individual wavelengths incident on the first beam splitter 240. In addition, the filter 220 rotates in a direction according to the control signal outputted from the control unit 600 to select visible light with individual wavelengths selected from the white visible light with various wavelengths, and makes the visible light with individual wavelengths incident on the first beam splitter 240.

Accordingly, the overlay measuring apparatus according to an alternative exemplary disclosed embodiment makes the visible light with various wavelengths generated by the light source 100 incident on the wafer W. Furthermore, the plurality of overlay patterns are formed on the wafer W. In addition, the visible light is selected with a single wavelength from the visible light with various wavelengths that are reflected on the wafer W so that the imaging unit 300 can acquire the visible light with a single wavelength.

At this time, even if the image of a plurality of overlay patterns is incorrectly represented due to the refraction or scattering of visible light with a predetermined wavelength, the filter 220 eliminates the visible light with the predetermined wavelength that causes the refraction or scattering, and selects visible light with a wavelength that does not cause the refraction or scattering and transmits it to the imaging unit 300. That is, according to the previously disclosed exemplary embodiment, visible light with a specific unit wavelength is selected from visible light that is incident on a plurality of overlay patterns. On the other hand, according to an alternative exemplary disclosed embodiment, after visible light with various wavelengths is incident on a plurality of overlay patterns, visible light with a specific unit wavelength is selected from the visible light that is reflected on the plurality of overlay patterns.

In an exemplary embodiment, the imaging unit 300 acquires images of the overlay patterns that are reflected on the wafer W and magnified and projected by the main objective lens 252 and the ocular lens 254. In particular, the imaging unit 300 can acquire the images of the overlay patterns at the focal point of the main objective lens 252 and ocular lens 254. For example, the imaging unit 300 may be an image sensor that detects information such as the images of the overlay patterns and converts it to an electrical image signal. To this end, the image sensor mainly consists of an imaging tube and a solid-state image sensor. Examples of the imaging tube include vidicon and plumbicon, and examples of the solid-state image sensor include a complementary metal-oxide-semiconductor (CMOS) image sensor and a charge-coupled device (CCD) image sensor. The imaging tube has many features. For example, the imaging tube is inexpensive and has a long life but is too low in resolution to be used in overlay measurement.

The solid-state image sensor is also called an imaging plate. In an exemplary embodiment, the solid-state image sensor performs a light-electricity conversion function of a group of pixels arranged in two dimensions (or in one dimension) on a semiconductor substrate on which the visible light is incident, and a scanning function to read charge images accumulated on the pixels in a predetermined order. In addition, the semiconductor substrate is formed of almost a single-crystal silicon substrate, and the pixels are formed to have a matrix array on the semiconductor substrate. Accordingly, the solid-state image sensor is sequentially read according to a scanning method of the amount of charge of a pixel, and generates an output signal current. Furthermore, in an exemplary embodiment, the solid-state image sensor uses a charge transmission method in which separated pixels are sequentially transmitted through a scanning signal generator. At this time, the CMOS image sensor uses a metal oxide semiconductor transistor and the CCD image sensor uses a charge coupled device in signal transmission of a light-receiving unit that receives the visible light.

The CMOS image sensor is a low power consumption imaging device that uses a MOS transistor which is a unipolar field effect active element using a semiconductor oxide film. Because the CMOS image sensor is designed to have symmetrical pairs of p-type and n-type transistors, it may be slow in operation speed but also has a low power consumption. On the other hand, the CCD image sensor uses passive elements, such as diodes or resistors, which are composed of a semiconductor thin film and a number of electrodes formed on the semiconductor thin film.

Accordingly, the imaging unit 300 can acquire high-resolution digital image signals by using the CCD or CMOS image sensor to obtain images of a plurality of overlay patterns that are magnified and projected by the optical module 200. In particular, the imaging unit 300 acquires a plurality of image signals that are produced by visible light with a single wavelength that is obtained by the filter 220. For example, when red light with a wavelength of about 7000 Å is selected by the filter 220, image signals containing a plurality of overlay patterns on the surface of the wafer W that are produced by the red light are output. In addition, when blue light with a wavelength of about 5000 Å is selected by the filter 220, image signals containing a plurality of overlay patterns on the surface of the wafer W that are produced by the blue light are output.

The database 400 receives the image signals containing a plurality of overlay patterns outputted from the imaging unit 300 and sequentially stores these images. The database 400 refers to a set of information that is collectively managed to be shared. Furthermore, the database 400 stores these images in a manner such that their retrieval and update may be performed efficiently. In an exemplary embodiment, the database 400 may have features such as the following: (1) The ability to distinguish between similar looking images; (2) The ability to be accessed by computers and be sequentially written to; and (3) The ability to compare the overlay patterns indicated by a plurality of images with one another. In addition, the database 400 receives from the control unit 600 information about the wavelength of the visible light selected by the filter 220 and stores this information together with the image signals outputted from the imaging unit 300. This storage of the wavelength information along with the image signals may permit the selection unit 500 to determine whether or not the overlay pattern image acquired by the imaging unit 300 is projected by the visible light with the single wavelength selected by the filter 220.

The selection unit 500 can represent a plurality of overlay patterns through a plurality of images using the image signals stored in the database 400. In addition, the selection unit 500 can also compare a plurality of overlay patterns represented by individual images with one another to select the clearest image. As shown in FIG. 7, in an exemplary embodiment, the plurality of overlay patterns includes a main pattern 130 that is formed on the wafer W by a preceding process, and a sub pattern 140 that is formed inside the main pattern 130 or formed to surround the outside of the main pattern 130 by a subsequent process. For example, the main pattern 130 may be formed by a preceding process to have a step from the surface of the wafer W and may also include a plurality of bars surrounding the outside of a square. In addition, the sub pattern 140 may be formed inside the main pattern 130 by a subsequent process in a square shape that is shorter in a side than the main pattern 130.

As shown in FIG. 8, in an exemplary embodiment, the main pattern 130 is formed in trench (reference numeral 150 of FIG. 4) with a predetermined line width or in bar shape on a first thin film 102. The first thin film 102 may be an interlayer insulation film such as a silicon oxide film, or a conductive layer such as a poly silicon film doped with conductive impurity. In an exemplary embodiment, a photolithographic process may be used to form a photoresist pattern on the wafer W or on the first thin film 102. In addition, an etching process may be used to form the trench 150 or bar by eliminating the wafer W or the first thin film 102 exposed by the photoresist pattern. Furthermore, an ashing process may also be used to eliminate the wafer W or the photoresist pattern formed on the wafer W. Subsequently, an interlayer insulation film with a predetermined thickness and a second thin film 104 made of a metal layer are formed on the wafer W on which the main pattern 130 is formed. Furthermore, a photoresist 106 with a predetermined thickness is formed on the second thin film 104. Moreover, the sub pattern 140 formed of the photoresist 106 that is patterned in square shape is formed inside the main pattern 130.

In an exemplary embodiment, the visible light with a wavelength that is equal or similar to the width of the trench 150 may be refracted or scattered, causing the image of the main pattern 130 to be distorted. In contrast, visible light with a wavelength that is shorter than the width of the trench 150 is not refracted or scattered while it is incident and reflected on the bottom of the trench 150. Thus, the visible light is refracted or scattered in direct proportion to wavelength of the visible light and in inverse proportion to line width of the main pattern 130. That is, the longer the wavelength of the visible light, the more the visible light is refracted or scattered. In addition, the shorter the line width of the main pattern 130, the more the visible light is refracted or scattered. Accordingly, the visible light is refracted or scattered by a lesser amount by reducing the wavelength of the visible light and increasing the line width of the main pattern 130. However, if the wavelength of the visible light is reduced to a one that is within the range of ultraviolet light, the photoresist 106 as the sub pattern 140 is now exposed to ultraviolet light that changes its chemical composition. This change in chemical composition of the photoresist 106 may lead to defective etching due to the damaged photoresist 106.

In addition, when the line width of the main pattern 130 becomes large, it may be different from the size of a minute pattern formed in an active area or cell area of the wafer W. This difference between the line width and the size of the pattern may make it difficult to calculate overlay compensation values. Accordingly, the selection unit 500 selects the best available image of the main pattern 130 by comparing the plurality of images of the main pattern 130 with one another. In an exemplary embodiment, when the plurality of overlay pattern images have different colors, the selection unit 500 processes the received image signals such that the entire image containing the image of the main pattern 130 is represented in black and white, and then compares the images of the main pattern 130 with one another. Furthermore, the selection unit 500 can conduct the black-and-white treatment based on the intensity of the visible light with respect to the overlay pattern image of the main pattern 130.

For example, the selection unit 500 can select a clear image of the main pattern 130 by overlapping the plurality of images of the main pattern 130. Thus, even though some of the images of the main pattern 130 may be damaged due to the refraction or scattering of the visible light, the selection unit 500 can compare the images of the main pattern 130 with one another and select at least one image that is a good image of the main pattern 130 and that is not damaged due to the refraction or scattering of the visible light. In addition, the selection unit 500 acquires information about the wavelength of visible light that is used when the imaging unit 300 acquires the overlay pattern image, and outputs this acquired information to the control unit 600.

The control unit 600 receives information concerning a single wavelength of the visible light selected by the filter 220 of the optical module 200 from the filter 220, and outputs the information to the database 400. In addition, the control unit 600 receives information about the wavelength of visible light used when the overlay pattern image selected by the selection unit 500 is projected from the selection unit 500. Moreover, the control unit 600 outputs a control signal to control the filter 220 so that the visible light with the corresponding unit wavelength can be selected by the filter 220 to make an overlay measurement. For example, the control unit 600 can output the control signal such that the filter 220 can select visible light with a plurality of unit wavelengths while moving back and forth on a straight line or rotating in any direction.

The reading unit 700 measures a deviation between a central position of the image of the main pattern 130 that is selected by the selection unit 500 and a central position of the image of the sub pattern 140. Based on this measured deviation, the reading unit 700 calculates an overlay compensation value. For example, the reading unit 700 reads the image of the main pattern 130 on X-axis and Y-axis. Based on this reading, the reading unit 700 calculates a central position between a plurality of bars perpendicular to the X-axis and a central position between a plurality of bars perpendicular to the Y-axis, and thus acquires central positions of the image of the main pattern 130 on X-axis and Y-axis. Similarly, the reading unit 700 calculates central positions of the sub pattern 140 on X-axis and Y-axis.

Moreover, the reading unit 700 compares the central position of the image of the main pattern 130 and the central position of the sub pattern 140 to calculate the overlay compensation value. In an exemplary embodiment, the overlay compensation value is a deviation of the sub pattern 140 from the main pattern 130 in X-axis and Y-axis. For example, when the central position of the image of the main pattern 130 and the central position of the sub pattern 140 match each other, the overlay compensation value is equal to '0". In addition, the overlay compensation value may be determined by calculating differences in positions between a plurality of primaries 130 formed on the wafer W and a plurality of secondaries 140 formed adjacent to the primaries 130, and averaging the differences in positions.

As described above, in an exemplary embodiment, the overlay measuring apparatus includes the optical module 200 which selects visible light with a single wavelength from among a plurality of wavelengths. The apparatus also includes the imaging unit 300, which acquires image signals from images of the plurality of overlay patterns projected by the optical module 200. In addition, the apparatus includes the selection unit 500, which selects a clear overlay pattern image from among the plurality of overlay pattern images acquired by the imaging unit 300. The apparatus also includes the control unit 600, which outputs a control signal to the optical module 200 so that the optical module 200 can project the overlay pattern with a specific color. Accordingly, it may be possible to prevent errors in overlay measurement due to the refraction or scattering of visible light with a specific wavelength. This reduction in errors in overlay measurement may help increase or maximize the yield rate.

Figure 9:
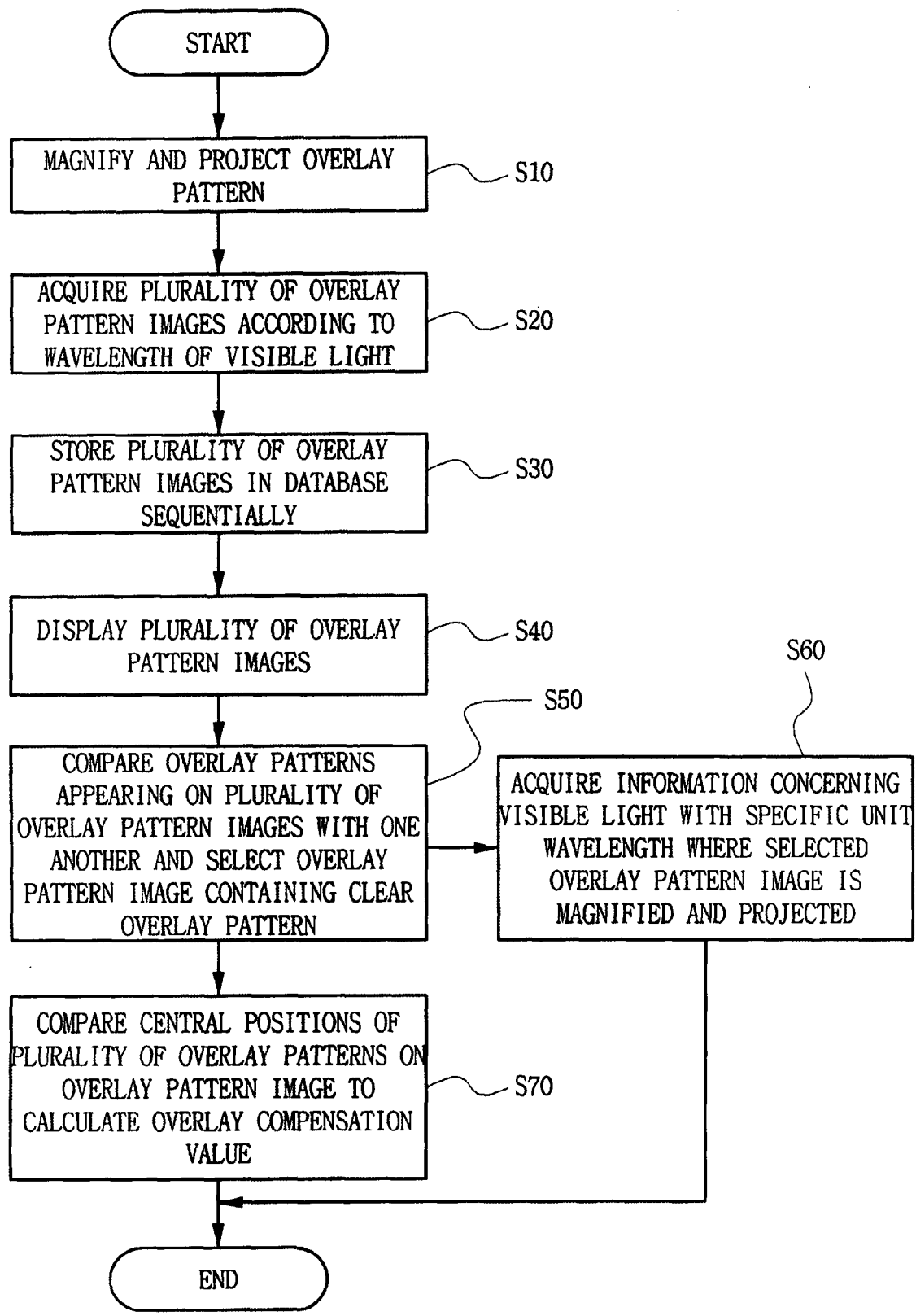
FIG. 9 illustrates a flow chart of an overlay measuring method according to an exemplary disclosed embodiment.

FIG. 9 illustrates a flow chart of an overlay measuring method according to an exemplary disclosed embodiment.

The optical module 200 magnifies and projects an overlay pattern formed on the wafer W (S10). Specifically, after the wafer W is arranged on a chuck, a central position of the wafer W is determined and the optical module 200 projects the overlay pattern at a predetermined distance from the central position of the wafer W. In addition, the main objective lens 252 magnifies and projects the overlay pattern at the central position of the wafer W. In particular, the main objective lens 252 of the optical module 200 moves its focal point to a central position (center of shot) of a chip formed at a predetermined distance from the central position of the wafer W, and magnifies at least a portion of the chip. For example, the main objective lens 252 of the optical module 200 can magnify and project a chip pattern to a size of about 12 mm. Moreover, the main objective lens 252 of the optical module 200 moves the focal point from the central position of the chip to a first alignment mark formed at an eye point of the edge of the chip, and magnifies and projects the first alignment mark. For example, the main objective lens 252 of the optical module 200 magnifies and projects the first alignment mark to a size of about 750 μm. In an exemplary embodiment, the first alignment mark has shapes of '[', ']', ']', '[' at corners of the chip. Furthermore, the eye point corresponding to the first alignment mark is a position at an alignment mark where the most excellent image can be acquired in the chip pattern. This eye point can be marked or selected by an operator.

In addition, the main objective lens 252 of the optical module 200 moves the focal point to a second alignment mark formed at a position coordinate (reference point of shot) adjacent to the first alignment mark. For example, the second alignment mark is formed to have '+' shape that is adjacent to the first alignment mark formed at the corner of the chip. Furthermore, the main objective lens 252 magnifies and projects the first and second alignment marks with the same or similar magnifications. Specifically, the main objective lens 252 moves the focal point to an overlay pattern formed at a predetermined distance from the second alignment mark, and magnifies and projects the overlay pattern. For example, the main objective lens 252 magnifies and projects the overlay pattern to a size of about 50 μm. In an exemplary embodiment, the optical module 200 makes light incident on the surface of the wafer W on which the overlay pattern is formed, and projects light reflected from the surface of the wafer W onto the imaging unit 300.

As described above, a plurality of overlay patterns can be projected using the optical module of the overlay measuring apparatus according to the exemplary disclosed embodiments. This may occur in many ways. For example, visible light with a single wavelength may first be selected from white visible light with various wavelengths supplied from the light source 100, and may be incident on the plurality of overlay patterns. Furthermore, when the imaging unit 300 acquires images of the plurality of overlay patterns projected by the visible light with a single wavelength, the plurality of overlay pattern images acquired by the imaging unit 300 may have different colors according to the wavelengths of the visible light. Similarly, when the white visible light with various wavelengths is incident on a plurality of overlay patterns, visible light with a single wavelength is selected from the white visible light projecting the plurality of overlay patterns. In addition, the imaging unit 300 acquires images of the plurality of overlay patterns. These images may have different colors according to the wavelengths of the visible light. Accordingly, the overlay measuring method according to exemplary disclosed embodiments selects visible light with a single wavelength prior to being incident on an overlay pattern, or selects visible light with a single wavelength from white visible light that is incident and reflected on the overlay pattern, and acquires a plurality of overlay pattern images indicating the plurality of overlay patterns according to the wavelength of the visible light (S20).

In an exemplary embodiment, the imaging unit 300 acquires the overlay pattern image from light that is reflected from the overlay pattern with a predetermined resolution. For example, the imaging unit 300 acquires the plurality of overlay pattern images with a resolution of more than about two million pixels. Next, the image signals outputted from the imaging unit 300 are sequentially stored in the database 400 (S30). In particular, the image signals are output according to a predetermined format of information acquired by the imaging unit 300. In addition, the outputted information is stored in the database 400 according to a standard corresponding to the overlay pattern image. The control unit 600 acquires information concerning the wavelength or color of the visible light selected by the filter 220 of the optical module 200, and inputs this information, together with the image signals acquired and outputted by the imaging unit 300, to the database 400. For example, when overlay compensation values are calculated with respect to the plurality of overlay patterns composed of the main pattern 130 and the sub pattern 140, image signals corresponding to seven images indicating the plurality of overlay patterns using visible light with seven individual wavelengths are sequentially stored in the database 400.

After the image signals corresponding to the plurality of images of overlay patterns are stored in the database 400, the control unit 600 controls the plurality of overlay pattern images to be displayed on the display unit using the image signal stored in the database 400 (S40). Specifically, the control unit 600 arranges the plurality of overlay pattern images in a line or overlaps the plurality of overlay pattern images so that the selection unit 500 can compare the overlay patterns with one another. The selection unit 500 can compare the plurality of overlay patterns and select a clearest one of the images of the plurality of overlay patterns (S50). For example, when the images of the sub pattern 140 are compared with one another by the selection unit 500, the visible light is measured while being close to the main objective lens 252 and exposed to air, and is measured while being incident on a section of the photoresist 106. Accordingly, because the overlay measurement is not affected by the wavelength of the visible light, it is possible to make a good overlay measurement.

In an overlay measuring apparatus, the visible light passes through the air and second thin film 104 and reflected on the main pattern. In addition, when the visible light passes through a slit corresponding to the trench 150, it is refracted or scattered at a wavelength which is similar to the slit. As a result, the image of the main pattern 130 may not be represented properly. However, in an exemplary embodiment, the optical module 200 selects visible light with a single wavelength that is incident on the main pattern 130 and projects the main pattern 130 without refraction or scattering, such that the imaging unit 300 can acquire a clear image of the overlay pattern. Furthermore, the control unit 600 acquires information concerning the wavelength of the visible light on the optical module 200 that acquires the overlay pattern image selected by the selection unit 500 (S60), and makes an overlay measurement using the visible light with the determined wavelength.

Accordingly, because the exemplary disclosed overlay measuring method includes acquiring a plurality of overlay pattern images using visible light with different wavelengths, and selecting a clear overlay pattern image from among the plurality of overlay pattern images, it may be possible to prevent errors in overlay measurement that are generated due to the refraction or scattering of the visible light with a specific wavelength. This reduction in errors in overlay measurement may increase or maximize the yield rate.

Finally, overlay compensation values are calculated by the reading unit 700 by comparing a central position of the image of the main pattern 130 with a central position of the image of the sub pattern 140 which appear on the overlay pattern image (S70). As described above, the reading unit 700 represents the image of the main pattern 130 on X-axis and Y-axis, calculates a central position between a plurality of bars perpendicular to the X-axis and a central position between a plurality of bars perpendicular to the Y-axis, and acquires central positions of the image of the main pattern 130 on X-axis and Y-axis. Similarly, the reading unit 700 calculates central positions of sides of the square forming the sub pattern 140 on X-axis and Y-axis. Ideally, the central position of the image of the main pattern 130 and the central position of the image of the sub pattern 140 should match each other. However, the central positions of the images of the main pattern and sub pattern 130 and 140 may deviate from each other by a predetermined distance due to an alignment error of the wafer W or due to some other condition occurring during the photolithography process. Therefore, the reading unit 700 calculates the overlay compensation values by comparing the central position of the image of the main pattern 130 and the central position of the image of the sub pattern 140 with each other. In addition, the overlay compensation values may be calculated by calculating differences in positions between a plurality of primaries 130 formed on the wafer W and a plurality of secondaries 140 formed adjacent to the primaries 130, and averaging the differences in positions. Moreover, the reading unit 700 outputs the overlay compensation values to an exposure apparatus so that the photoresist pattern can be accurately formed on a position that is determined in the photolithographic process.

Accordingly, because the exemplary disclosed overlay measuring method includes acquiring a plurality of overlay pattern images using visible light with different wavelengths, selecting a clear overlay pattern image and using the visible light with the single wavelength corresponding to the selected overlay pattern image to make an overlay measurement, it may be possible to prevent errors in overlay measurement that are generated due to the refraction or scattering of the visible light with a specific wavelength. This reduction in errors in overlay measurement may increase or maximize the yield rate.

The invention has been described using exemplary embodiments. However, it is to be understood that the scope of the invention is not limited to the disclosed embodiments. On the contrary, the scope of the invention is intended to include various modifications and alternative arrangements within the capabilities of persons skilled in the art using presently known or future technologies and equivalents. The scope of the claims, therefore, should be accorded the broadest interpretation so as to encompass all such modifications and similar arrangements.

What is claimed is:

1. An overlay measuring apparatus, comprising:
   a light source which generates visible light with a plurality of wavelengths;
   an optical module which selects visible light with a single wavelength from the visible light generated by the light source, makes the visible light with a single wavelength incident on a plurality of overlay patterns, and uses visible light reflected from the plurality of overlay patterns to project the overlay patterns with a predetermined color;
   an imaging unit which acquires images of the plurality of overlay patterns according to individual wavelengths of the visible light and acquires image signals corresponding to the images;
   a database which sequentially stores the image signals acquired by the imaging unit;
   a selection unit which selects a clear image from the overlay pattern images using the image signals stored in the database; and
   a control unit which outputs a control signal to the optical module so that the optical module projects the overlay pattern with a specific color using information associated with the individual wavelengths of the visible light that is used to project the overlay pattern image selected by the selection unit.

2. The overlay measuring apparatus according to claim 1, further comprising a reading unit which reads a deviation in the plurality of overlay patterns that appear on the overlay pattern image selected by the selection unit.

3. The overlay measuring apparatus according to claim 1, further comprising a display unit which displays a plurality of overlay pattern images on which a plurality of overlay patterns appear, using the image signals stored in the database, and displays the overlay pattern image selected by the selection unit.

4. The overlay measuring apparatus according to claim 1, wherein the optical module comprises:
   a first reflective mirror which reflects the visible light generated by the light source;
   a filter which filters the visible light with the plurality of wavelengths to select visible light with a single wavelength;
   an optical fiber which changes a transmission path of the visible light filtered by the filter;
   a beam splitter which splits the visible light emitted from the optical fiber; and
   a projection unit which magnifies and projects the visible light split by the beam splitter onto a surface of a wafer, and magnifies and projects visible light reflected from the surface of the wafer onto the imaging unit.

5. The overlay measuring apparatus according to claim 4, wherein the filter selects visible light with the single wavelength from the visible light with the plurality of wavelengths while moving back and forth on a straight line according to a control signal outputted from the control unit.

6. The overlay measuring apparatus according to claim 4, wherein the filter selects visible light with the single wavelength from the visible light with the plurality of wavelengths while rotating according to a control signal outputted from the control unit.

7. The overlay measuring apparatus according to claim 4, wherein the beam splitter comprises a half mirror.

8. The overlay measuring apparatus according to claim 4, wherein the projection unit comprises a main objective lens which makes the visible light incident on a plurality of overlay patterns formed on the surface of the wafer, and an ocular lens which uses the visible light that is incident on the surface of the wafer through the main objective lens and reflected from the surface of the wafer to magnify and project the plurality of overlay patterns.

9. The overlay measuring apparatus according to claim 8, wherein the main objective lens comprises an apochromatic objective lens.

10. The overlay measuring apparatus according to claim 1, wherein the control unit receives, from the filter, information about the single wavelength of the visible light selected by the optical module, and inputs the information to the database.

11. The overlay measuring apparatus according to claim 1, wherein the selection unit performs black-and-white treatment on the plurality of overlay pattern images and selects a clear overlay pattern image.

12. The overlay measuring apparatus according to claim 11, wherein the selection unit performs black-and-white treatment on an overlay pattern image according to the intensity of the visible light with a predetermined color.

13. An overlay measuring apparatus, comprising:
- a light source which generates visible light with a plurality of wavelengths;
- an optical module which makes the visible light incident on an overlay pattern, and selects visible light with a single wavelength that is reflected from the overlay pattern so that the overlay pattern is projected with a predetermined color;
- an imaging unit which acquires images of the plurality of overlay patterns according to individual wavelengths of the visible light and acquires image signals corresponding to the images;
- a database which sequentially stores the image signals acquired by the imaging unit;
- a selection unit which selects a clear image from the overlay pattern images using the image signals stored in the database; and
- a control unit which outputs a control signal to the optical module so that the optical module projects the overlay pattern with a specific color using information associated with the single wavelength of the visible light that is used to project the overlay pattern image selected by the selection unit.

14. The overlay measuring apparatus according to claim 13, further comprising a reading unit which reads a deviation in the plurality of overlay patterns that appear on the overlay pattern image selected by the selection unit.

15. The overlay measuring apparatus according to claim 13, further comprising a display unit which displays a plurality of overlay pattern images on which a plurality of overlay patterns appear using the image signals stored in the database, and displays the overlay pattern image selected by the selection unit.

16. The overlay measuring apparatus according to claim 13, wherein the optical module comprises:
- a reflective mirror which reflects the visible light generated by the light source;
- an optical fiber which changes a transmission path of the visible light reflected by the reflective mirror;
- a beam splitter which splits the visible light emitted from the optical fiber;
- a projection unit which magnifies and projects the visible light split by the beam splitter onto a surface of a wafer, and magnifies and projects visible light reflected from the surface of the wafer onto the imaging unit; and
- a filter which selects visible light with a single wavelength from the visible light with a plurality of wavelengths projected by the projection unit, and applies the visible light with a single wavelength to the imaging unit.

17. The overlay measuring apparatus according to claim 16, wherein the filter selects visible light with the single wavelength from the visible light with a plurality of wavelengths while moving back and forth on a straight line according to a control signal outputted from the control unit.

18. The overlay measuring apparatus according to claim 16, wherein the filter selects visible light with the single wavelength from the visible light with the plurality of wavelengths while rotating according to a control signal outputted from the control unit.

19. The overlay measuring apparatus according to claim 16, wherein the beam splitter comprises a half mirror.

20. The overlay measuring apparatus according to claim 16, wherein the projection unit comprises a main objective lens which makes the visible light incident on the plurality of overlay patterns formed on the surface of the wafer, and an ocular lens which uses the visible light incident on the surface of the wafer through the main objective lens and reflected from the surface of the wafer to magnify and project the overlay patterns.

21. The overlay measuring apparatus according to claim 20, wherein the main objective lens comprises an apochromatic objective lens.

22. The overlay measuring apparatus according to claim 13, wherein the control unit receives, from the filter, information about the single wavelength of the visible light that is selected by the optical module, and inputs the information to the database.

23. The overlay measuring apparatus according to claim 13, wherein the selection unit performs black-and-white treatment on the plurality of overlay pattern images and selects a clear overlay pattern image.

24. The overlay measuring apparatus according to claim 13, wherein the selection unit performs black-and-white treatment on an overlay pattern image according to the intensity of the visible light with a predetermined color.

25. An overlay measuring method, comprising:
- acquiring a plurality of overlay pattern images according to individual wavelengths of visible light that is used to project a plurality of overlay patterns;
- storing, in a database, signals corresponding to the plurality of overlay pattern images that are acquired according to individual wavelengths of the visible light;
- displaying the plurality of overlay pattern images using the image signals stored in the database, comparing clearness of the plurality of overlay patterns appearing on the plurality of overlay pattern images, and selecting, by a selection unit, a clear image from the overlay pattern images on which the plurality of overlay patterns appear; and
- magnifying and projecting the plurality of overlay patterns using the visible light with a corresponding wavelength that is used to acquire the overlay pattern image selected by the selection unit.

26. The overlay measuring method according to claim 25, further comprising calculating overlay compensation values using a central position of an overlay pattern appearing on the overlay pattern image selected by the selection unit.

27. The overlay measuring method according to claim 25, wherein the acquiring of the plurality of overlay pattern images further comprises magnifying and projecting the plurality of overlay patterns formed on a surface of a wafer by an optical module.

28. The overlay measuring method according to claim 27, wherein the overlay pattern image is acquired by selecting visible light with a single wavelength, making the selected visible light incident on the surface of the wafer, and projecting the visible light.

29. The overlay measuring method according to claim 27, wherein the overlay pattern image is acquired by selecting visible light with a predetermined single wavelength from visible light with a plurality of wavelengths that is incident on and reflected from the surface of the wafer and that projects the overlay pattern.

30. The overlay measuring method according to claim 25, wherein the database stores the image signals corresponding to the plurality of overlay pattern images, and information concerning the individual wavelengths of the visible light.

* * * * *